US012666953B2

(12) United States Patent
Wang et al.

(10) Patent No.: US 12,666,953 B2
(45) Date of Patent: Jun. 23, 2026

(54) THREE-DIMENSIONAL MEMORY DEVICES AND METHODS FOR FORMING THE SAME

(71) Applicant: YANGTZE MEMORY TECHNOLOGIES CO., LTD., Wuhan (CN)

(72) Inventors: Di Wang, Wuhan (CN); Wenxi Zhou, Wuhan (CN); Zhong Zhang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 555 days.

(21) Appl. No.: 17/842,452

(22) Filed: Jun. 16, 2022

(65) Prior Publication Data

US 2023/0411285 A1     Dec. 21, 2023

(51) Int. Cl.
| | |
|---|---|
| *H10B 41/27* | (2023.01) |
| *H10B 43/27* | (2023.01) |
| *H10W 20/20* | (2026.01) |
| *H10W 20/41* | (2026.01) |

(52) U.S. Cl.
CPC .......... *H10W 20/435* (2026.01); *H10B 41/27* (2023.02); *H10B 43/27* (2023.02); *H10W 20/20* (2026.01)

(58) Field of Classification Search
CPC ....... H10B 41/27; H10B 43/27; H01L 23/535; H01L 23/5283; H10W 20/435; H10W 20/20; H10W 72/823; H10W 20/211; H10W 20/212; H10W 20/2125; H10W 20/2128; H10W 20/213; H10W 20/2134; H10W 20/215; H10W 20/216; H10W 20/217; H10W 20/218; H10W 20/222; H10W 20/23
See application file for complete search history.

(56) References Cited

U.S. PATENT DOCUMENTS

| | | | | |
|---|---|---|---|---|
| 2021/0193681 A1* | 6/2021 | Baek | ................. | H01L 21/76895 |
| 2021/0233917 A1* | 7/2021 | Sakui | ..................... | G11C 16/10 |
| 2021/0296334 A1* | 9/2021 | Zhang | .................... | H10B 43/50 |
| 2022/0028440 A1* | 1/2022 | Tang | ........................ | G11C 8/14 |
| 2022/0028878 A1* | 1/2022 | Park | ....................... | H10B 43/27 |

* cited by examiner

*Primary Examiner* — Matthew C Landau
*Assistant Examiner* — David W Ward
(74) *Attorney, Agent, or Firm* — BAYES PLLC

(57) ABSTRACT

In certain aspects, a three-dimensional (3D) memory device includes a stack structure, and a slit structure extending. The stack structure includes interleaved conductive layers and dielectric layers. Edges of the interleaved conductive layers and dielectric layers define a staircase structure. Each one of the conductive layers has a thickened portion in the staircase structure. The thickened portion extends along a first direction. The slit structure extends through the stack structure and along a second direction perpendicular to the first direction, such that the slit structure cuts off at least one, but not all, of the thickened portions of the conductive layers.

16 Claims, 15 Drawing Sheets

700

100

200

300

400

<u>500</u>

600

1004
1003 } 1002
1001

1005

1004
1003 } 1002
1001

1200

1300
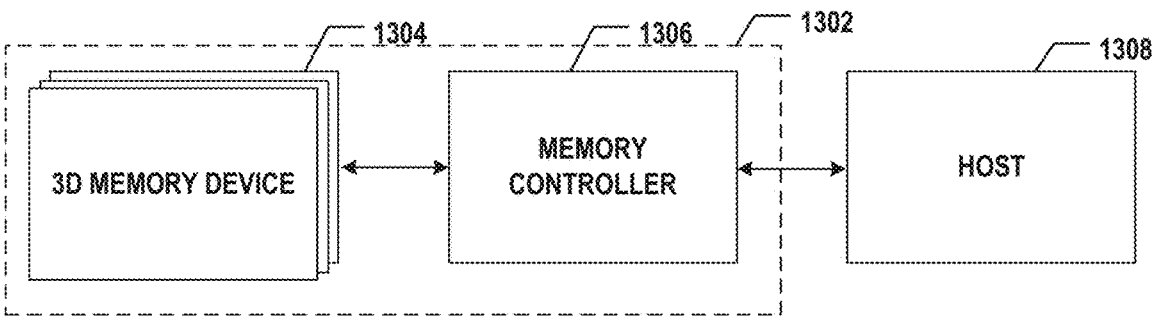
FIG. 13
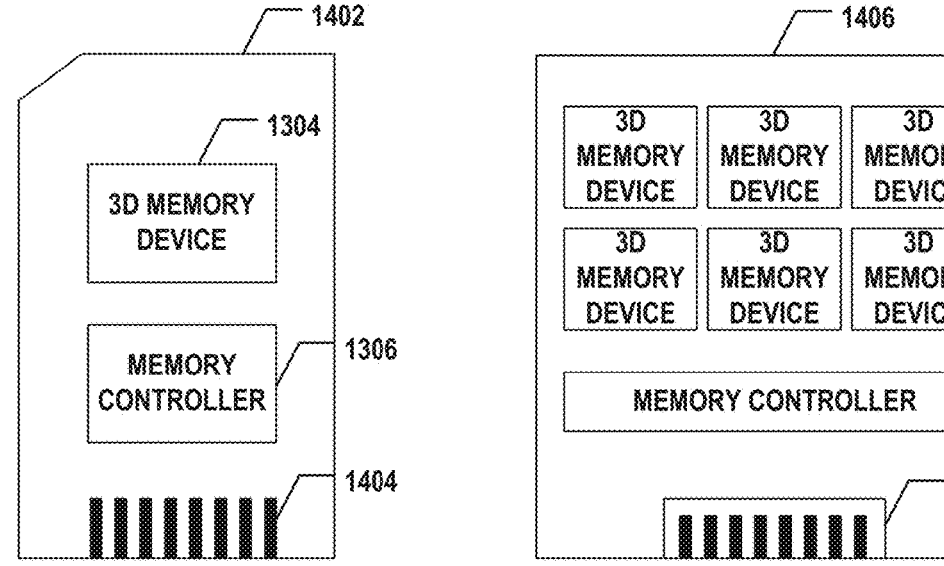
FIG. 14A                    FIG. 14B

THREE-DIMENSIONAL MEMORY DEVICES AND METHODS FOR FORMING THE SAME

BACKGROUND

The present disclosure relates to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

In one aspect, a 3D memory device includes a stack structure and a slit structure extending. The stack structure includes interleaved conductive layers and dielectric layers. Edges of the interleaved conductive layers and dielectric layers define a staircase structure. Each one of the conductive layers has a thickened portion in the staircase structure. The thickened portion extends along a first direction. The slit structure extends through the stack structure and along a second direction perpendicular to the first direction, such that the slit structure cuts off at least one, but not all, of the thickened potions of the conductive layers.

In another aspect, a 3D memory device includes a semiconductor layer, a stack structure, and a channel structure. The stack structure includes interleaved conductive layers and dielectric layers. Edges of the interleaved conductive layers and dielectric layers define a staircase structure. Each one of the conductive layers has a thickened portion in the staircase structure. The thickened portion extends along a first direction. The channel structure extends through the stack structure and in contact with the semiconductor layer. At least the thickened portion of a first conductive layer of the conductive layers is continuous along the first direction. At least the thickened portion of a second conductive layer of the conductive layers is discontinuous along the first direction. The first conductive layer is closer to the semiconductor layer than the second conductive layer.

In still another aspect, a system includes a 3D memory configured to store data. The 3D memory device includes a semiconductor layer, a stack structure, and a channel structure. The stack structure includes interleaved conductive layers and dielectric layers. Edges of the interleaved conductive layers and dielectric layers define a staircase structure. Each one of the conductive layers has a thickened portion in the staircase structure. The thickened portion extends along a first direction. The channel structure extends through the stack structure and in contact with the semiconductor layer. At least the thickened portion of a first conductive layer of the conductive layers is continuous along the first direction. At least the thickened portion of a second conductive layer of the conductive layers is discontinuous along the first direction. The first conductive layer is closer to the semiconductor layer than the second conductive layer. The system also includes a memory controller coupled to the 3D memory device and configured to control operations of the channel structure via the first conductive layer and the second conductive layer.

In yet another aspect, a method for forming a 3D memory device is disclosed. A stack structure including interleaved first material layers and second material layers is formed. A staircase structure of the stack structure is formed. Third material layers each disposed on a respective one of the first material layers in the staircase structure and extending along a first direction are formed. A slit opening extending through the stack structure and along a second direction perpendicular to the first direction is formed, such that the slit opening cuts off at least one, but not all, of the third material layers.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIG. 13 illustrates a block diagram of an exemplary system having a 3D memory device, according to some aspects of the present disclosure.

FIG. 14A illustrates a diagram of an exemplary memory card having a 3D memory device, according to some aspects of the present disclosure.

FIG. 14B illustrates a diagram of an exemplary solid-state drive (SSD) having a 3D memory device, according to some aspects of the present disclosure.

Figures 1, 2:
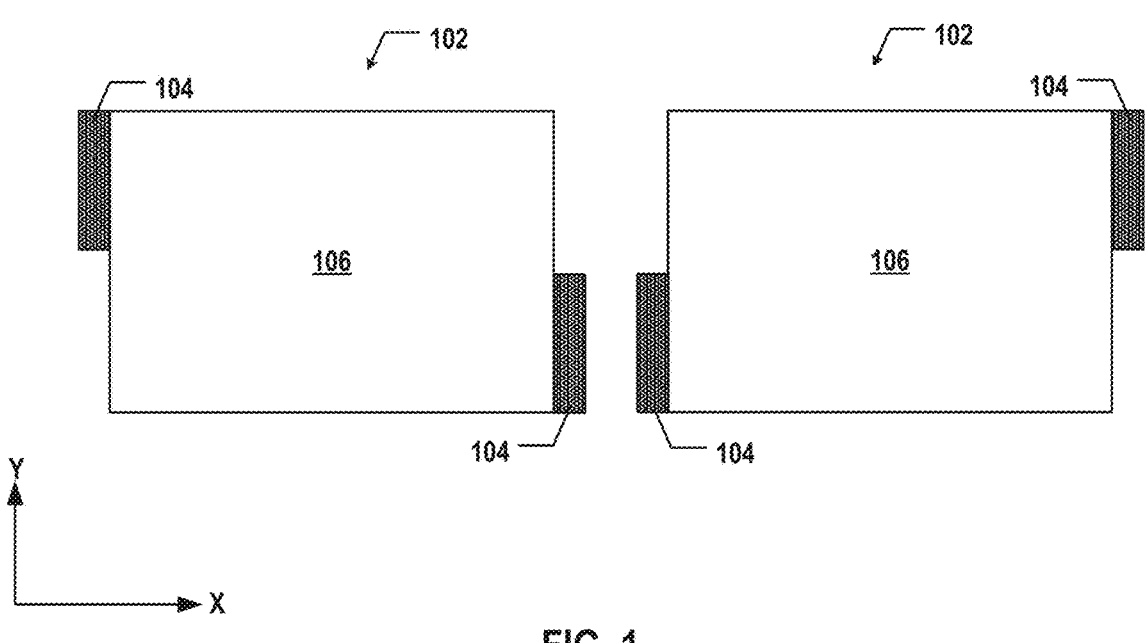
FIG. 1 illustrates a schematic diagram of a 3D memory device having staircase structures, according to some aspects of the present disclosure.
FIG. 2 illustrates a schematic diagram of another 3D memory device having staircase structures, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical interconnect access (via) contacts are formed) and one or more dielectric layers.

In some memory devices, such as 3D NAND memory devices, memory cells for storing data are stacked in channel structures extending through a stack structure (e.g., a memory stack) in channel structures. 3D memory devices include staircase structures formed on one or more sides (edges) of the stacked structure for purposes such as word line fan-out. To reduce the power consumption and/or read disturbance, a cut structure is introduced to cut the source select gate (SSG) line at the bottom of the stack structure to achieve "by finger" control of the channel structures, for example, during read operations.

Further, as the number of stacked layers in 3D NAND Flash memory devices keeps increasing, gate-induced-drain-leakage (GIDL)-assisted body biasing becomes more suitable than other erase mechanisms, such as P-well bulk erase, for erase operations to ensure the erase effectiveness and variability control. During GIDL erase operations, additional conductive layer(s) at the bottom of the stack structure, for example, below the SSG line(s), are used as the GIDL line(s) to achieve "by block" control of the channel structures.

On the other hand, as the number of stacked layers in 3D NAND Flash memory devices keeps increasing, the thickness of each conductive layer keeps decreasing, which in turn reduces the landing windows of the word line contacts that land on the edges of the conductive layers in the staircase structure (i.e., the stairs of the word lines). To reduce the risk that a word line contact may penetrate through a corresponding word line having a small thickness to short the underneath word line, contact landing layers are used in some 3D NAND Flash memory devices to increase the thickness of the land areas of word lines in the staircase structure. However, the contact landing layers deposited after the formation of the SSG lines and the staircase structure will electrically connect the discontinuous SSG lines, which have been cut off by the cut structure, again in the staircase structure, thereby undermining the "by finger" control of the channel structures.

To address one or more of the aforementioned issues, the present disclosure introduces a solution that in the staircase structure cuts off the contact landing layer on the SSG line, but not the contact landing layer on the GIDL line, using a slit structure (e.g., gate line slit (GLS)) to enable both "by finger" control and "by block" control of channel structures. Moreover, since in the staircase structure, the GIDL line is disposed below the SSG line, by leaving the contact landing layer on the GIDL line intact, the already long slit structure does not need to extend all the way to the end of the staircase structure in order to cut the GIDL line and the contact landing layer thereon. As a result, the mechanical stability of the slit structure can be improved, thereby increasing the product yield of the 3D memory devices.

FIG. 1 illustrates a schematic diagram of a 3D memory device 100 having staircase structures 104, according to some aspects of the present disclosure. 3D memory device 100 can include multiple memory planes 102 each having a memory cell array in a memory array structure 106. It is noted that x and y axes are included in FIG. 1 to illustrate two orthogonal (perpendicular) directions in the wafer plane. The x-direction is the word line direction of 3D memory device 100, and the y-direction is the bit line direction of 3D memory device 100. 3D memory device 100 can also include two staircase structures 104 at opposite sides in the x-direction of each memory array structure 106. Each word line of memory plane 102 can extend laterally in the x-direction across the entire memory plane 102 to a respective stair (level) in staircase structure 104. In some implementations, 3D memory device 100 is a NAND Flash memory device in which memory cells are provided in the form of an array of NAND memory strings (not shown) in memory array structure 106. Memory array structure 106 can include any other suitable components including, but not limited to, GLSs, through array contacts (TACs), array common sources (ACSs), etc.

FIG. 2 illustrates a schematic diagram of a 3D memory device 200 having staircase structures 204, according to some aspects of the present disclosure. In some implementations, 3D memory device 200 includes multiple memory planes 202. Each memory plane 102 can include a memory array structure 206-1/206-2 and a staircase structure 204 in the intermediate of memory array structure 206-1/206-2 and laterally dividing memory array structure 206-1/206-2 into a first memory array structure 206-1 and a second memory array structure 206-2 in the x-direction (the word line direction). In some implementations, for each memory plane 202, staircase structure 204 is in the middle of memory array structure 206-1/206-2. That is, staircase structure 204 can be a center staircase structure, which equally divides memory array structure 206-1/206-2 into first and second memory array structures 206-1 and 206-2 with the same number of memory cells. For example, first and second memory array structures 206-1 and 206-2 may be symmetric in the x-direction with respect to center staircase structure 204. It is understood that in some examples, staircase structure 204 may be in the intermediate, but not in the middle (center), of memory array structure 206-1/206-2, such that first and second memory array structures 206-1 and 206-2 may have different sizes and/or numbers of memory cells. In some implementations, 3D memory device 200 is a NAND Flash memory device in which memory cells are provided in the form of an array of NAND memory strings (not shown) in first and second memory array structures 206-1 and 206-2. First and second memory array structures 206-1 and 206-2 can include any other suitable components including, but not limited to, GLSs, TACs, ACSs, etc. Each word line (not shown) of memory plane 202 extending laterally in the x-direction can be separated by staircase structure 204 into two parts: a first word line part across first memory array structure 206-1, and a second word line part across second memory array structure 206-2. As described below, the two parts of each word line can be electrically connected by a bridge structure (not shown) in staircase structure 204 at a respective stair in staircase structure 204.

Although in FIGS. 1 and 2, staircase structures 104 and 204 are functional staircase structures used for landing interconnects (e.g., word line contacts), it is understood that additional staircase structures (e.g., dummy staircase structures, not shown) may be formed at one or more sides as well for balancing load in etching or chemical mechanical polishing (CMP) processes during fabrication.

Figure 3:
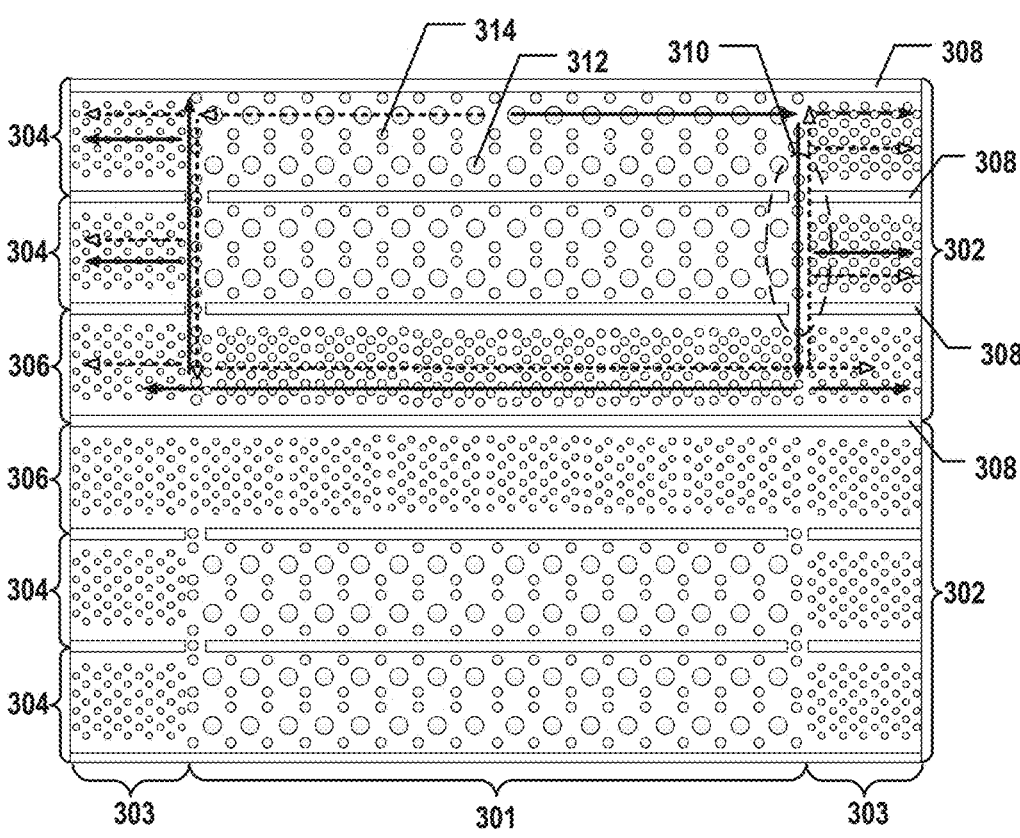
FIG. 3 illustrates a plan view of a 3D memory device having a staircase region, according to some aspects of the present disclosure.
Figure 3:
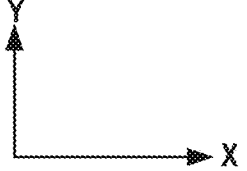

FIG. 3 illustrates a plan view of a 3D memory device 300 having a staircase region 301, according to some aspects of the present disclosure. 3D memory device 300 may be one example of part of memory plane 202 in FIG. 2 that includes staircase structure 204, and staircase region 301 of 3D memory device 300 may be one example of a region in which staircase structure 204 is formed in memory plane 202. As shown in FIG. 3, 3D memory device 300 can include multiple blocks 302 in the y-direction (the bit line direction) separated by parallel slit structures 308 (GLSs). In some implementations in which 3D memory device 300 is a NAND Flash memory device, each block 302 is the smallest erasable unit of the NAND Flash memory device. That is, 3D memory device 300 can achieve "by block" control of memory cells during erase operations. Each block 302 can further include multiple fingers 304 in the y-direction separated by some of slit structures 308 with "H" cuts 310.

In some implementations, staircase region 301 is in the intermediate (e.g., the middle) of 3D memory device 300 in the x-direction (the word line direction). In some implementations, FIG. 3 also shows a pair of core array regions 303 of the memory array structure in which an array of channel structures can be formed. It is understood that FIG. 3 only illustrates portions of core array regions 303 that are adjacent to staircase region 301. Core array regions 303 can include drain select gates (a.k.a. top select gate (TSGs), not shown), which can be individually driven or electrically connected by interconnects over staircase region 301, and the portions of core array regions 303 shown in FIG. 3 can be used to form the TSGs. As described below in detail, staircase region 301 can include multiple staircase zones each corresponding to a respective finger 304, and can include multiple bridge structures 306 each between two adjacent staircase zones in the y-direction. Each staircase zone can be in one or two blocks 302. 3D memory device 300 can include a plurality of dummy channel structures 314 in the staircase zones and bridge structures 306 to provide mechanical support and/or load balancing. 3D memory device 300 can further include word line contacts 312 in the staircase zones of staircase region 301 to be each landed on a respective word line (not shown) at each stair in staircase region 301 for word line driving.

Each bridge structure 306 connects (both physically and electrically) the first memory array structure and the second memory array structure (not shown), according to some implementations. That is, the staircase structures in staircase region 301 do not completely cut off the memory array structure in the intermediate, but instead leave the first and second memory array structures connected by bridge structures 306 thereof, according to some implementations. Each word line thus can be bilaterally driven (in both positive and negative x-directions) from a respective word line contact 312 in the staircase zones of staircase region 301 in the intermediate of 3D memory device 300 through bridge structures 306. For example, FIG. 3 further illustrates exemplary current paths of a bilateral word line-driving scheme with bridge structures 306. A first current path indicated by the solid arrows and a second current path indicated by the hollow arrows represent currents passing through two separate word lines at different levels, respectively.

Figure 4:
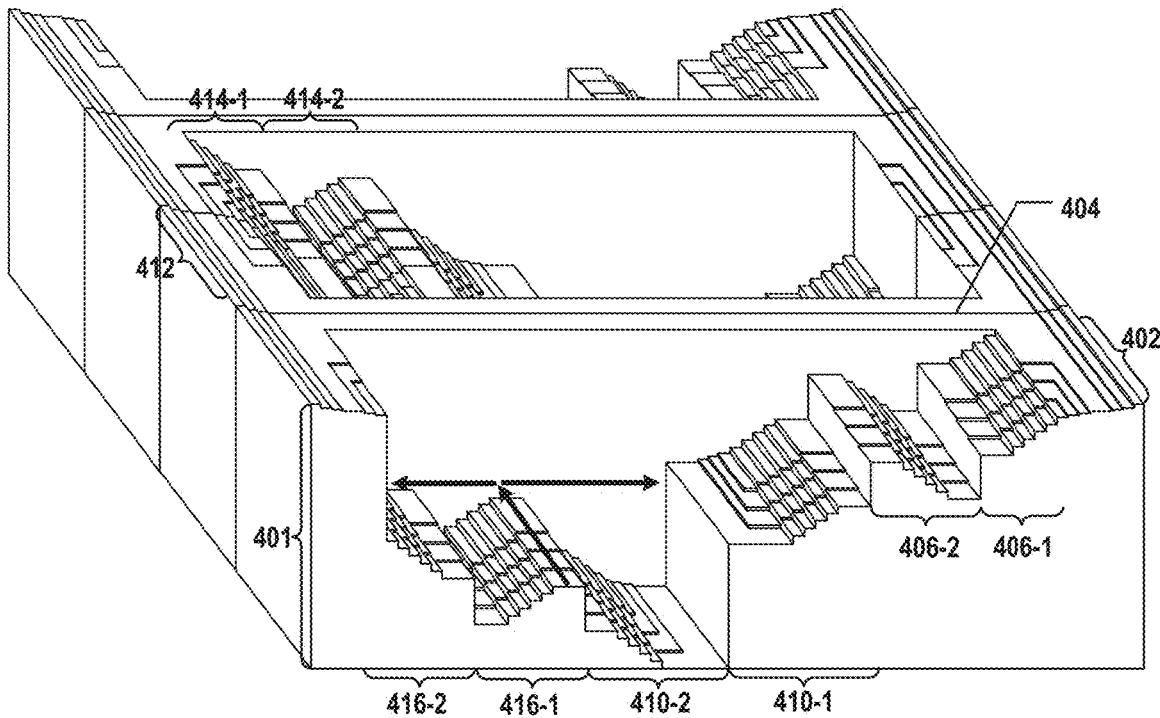
FIG. 4 illustrates a top perspective view of a staircase region of a 3D memory device, according to some aspects of the present disclosure.
Figure 4:
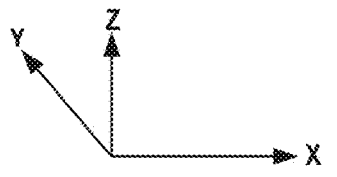

FIG. 4 illustrates a top perspective view of a staircase region 400 of a 3D memory device, according to some aspects of the present disclosure. Staircase region 400 may be one example of staircase region 301 of 3D memory device 300 in FIG. 3. In staircase region 400, a stack structure 401 can be formed on a substrate (not shown), which can include silicon (e.g., single crystalline silicon), silicon germanium (SiGe), gallium arsenide (GaAs), germanium (Ge), silicon on insulator (SOI), or any other suitable materials.

It is noted that x, y, and z axes are included in FIG. 4 to further illustrate the spatial relationship of the components in stack structure 401. The substrate of the 3D memory device includes two lateral surfaces extending laterally in the x-y plane: a top surface on the front side of the wafer on which stack structure 401 can be formed, and a bottom surface on the backside opposite to the front side of the wafer. The z-axis is perpendicular to both the x and y axes. As used herein, whether one component (e.g., a layer or a device) is "on," "above," or "below" another component (e.g., a layer or a device) of the 3D memory device is determined relative to the substrate of the 3D memory device in the z-direction (the vertical direction perpendicular to the x-y plane) when the substrate is positioned in the lowest plane of the 3D memory device in the z-direction. The same notion for describing the spatial relationship is applied throughout the present disclosure.

Stack structure 401 can include vertically interleaved first material layers and second material layers that are different from the first material layers. The first material layers and second material layers can alternate in the vertical direction. In some implementations, stack structure 401 can include a plurality of material layer pairs stacked vertically in the z-direction, each of which includes a first material layer and a second material layer. The number of the material layer pairs in stack structure 401 can determine the number of memory cells in the 3D memory device.

In some implementations, the 3D memory device is a NAND Flash memory device, and stack structure 401 is a stacked storage structure through which NAND memory strings are formed. Each of the first material layers includes a conductive layer, and each of the second material layers includes a dielectric layer. That is, stack structure 401 can include interleaved conductive layers and dielectric layers (not shown). In some implementations, each conductive layer can function as a gate line of the NAND memory strings and a word line extending laterally from the gate line and ending at staircase structures 406, 410, and 416 for word line fan-out. The conductive layers can include conductive materials including, but not limited to, tungsten (W), cobalt (Co), copper (Cu), aluminum (Al), polycrystalline silicon (polysilicon), doped silicon, silicides, or any combination thereof. The dielectric layers can include dielectric materials including, but not limited to, silicon oxide, silicon nitride, silicon oxynitride, or any combination thereof. In some implementations, the conductive layers include metals, such as tungsten, and the dielectric layers include silicon oxide.

Each stair (a.k.a. "level") of staircase structures 406, 410, and 416 can include one or more material layer pairs. In some implementations, the top material layer of each stair is a conductive layer for interconnection in the vertical direction. In some implementations, every two adjacent stairs of staircase structures 406, 410, and 416 are offset by a nominally same distance in the z-direction and a nominally same distance in the x-direction. Each offset thus can form a "landing area" for interconnection with word line contacts (e.g., 312 in FIG. 3, not shown in FIG. 4) of the 3D memory device in the z-direction direction.

As shown in FIG. 4, staircase region 400 can include a first staircase zone 402, a second staircase zone 412, and a bridge structure 404 between first staircase zone 402 and second staircase zone 412 in the y-direction (the bit line direction). In some implementations, first staircase zone 402 includes a plurality pairs of staircase structures including a first pair of staircase structures 406-1 and 406-2, a second pair of staircase structures 410-1 and 410-2, and a third pair of staircase structures 416-1 and 416-2 in the x-direction (the word line direction). Each staircase structure 406-1, 406-2, 410-1, 410-2, 416-1, or 416-2 includes a plurality of stairs in the x-direction, according to some implementations. In some implementations, each staircase structure 406-1, 406-2, 410-1, 410-2, 416-1, or 416-2 is a functional staircase structure used for landing interconnects (e.g., word line via contacts), as opposed to a dummy staircase structure. In other words, none of staircase structures 406-1, 406-2, 410-1, 410-2, 416-1, and 416-2 in first staircase zone 402 is a dummy staircase, according to some implementations.

Although first staircase zone 402 is described above in detail, it is understood that the scheme of arranging staircase structures in first staircase zone 402 disclosed herein may be similarly applied to second staircase zone 412 or any other staircase zones in staircase region 400. For example, second staircase zone 412 may include a pair of staircase structures 414-1 and 414-2 facing each other in the x-direction and at different depths, like first staircase zone 402.

Bridge structure 404 can include vertically interleaved conductive layers and dielectric layers (not shown), and the conductive layers (e.g., metal layers or polysilicon layers) can function as part of word lines. Different from at least some staircases in first and staircase zones 402 and 412 in which the word lines therein are cut off from the memory array structure in the x-direction (e.g., in the positive x-direction, the negative x-direction, or both), the word lines in bridge structure 404 can be preserved to bridge the word line contacts landed on staircase structures 406, 410, and 416 and the memory array structures in order to achieve the bilateral word line-driving scheme. In some implementations, at least one stair in a staircase structure in first or second staircase zone 402 or 412 is electrically connected to at least one of the first memory array structure and the second memory array structure through bridge structure 404. At least one word line can extend laterally in the memory array structure and bridge structure 404, such that the at least one stair can be electrically connected to the at least one of the first and second memory array structures through bridge structure 404 by the at least one word line. In one example, a stair in staircase structure 406-1 may be electrically connected to the first memory array structure (in the negative x-direction) by a respective word line part extending in the negative x-direction through bridge structure 404. Bridge structure 404, however, may not be needed to electrically connect the same stair to the second memory array structure (in the positive x-direction) because the respective word line part extending in the positive x-direction is not cut off. In another example, a stair in staircase structure 416-2 may be electrically connected to the second memory array structure (in the positive x-direction) by a respective word line part extending in the positive x-direction through bridge structure 404. Bridge structure 404, however, may not be needed to electrically connect the same stair to the first memory array structure (in the negative x-direction) because the respective word line part extending in the negative x-direction is not cut off.

In some implementations, the at least one stair in staircase structures 406, 410, 414, and 416 in first and second staircase zones 402 and 412 is electrically connected to each of the first memory array structure and the second memory array structure through bridge structure 404. For example, as shown in FIG. 4, a stair in staircase structure 416-1 may be electrically connected to both the first and second memory array structures through bridge structure 404 by the respective word line parts extending in the negative and positive x-directions, respectively, as indicated by the current paths (represented by the arrows).

Figure 5:
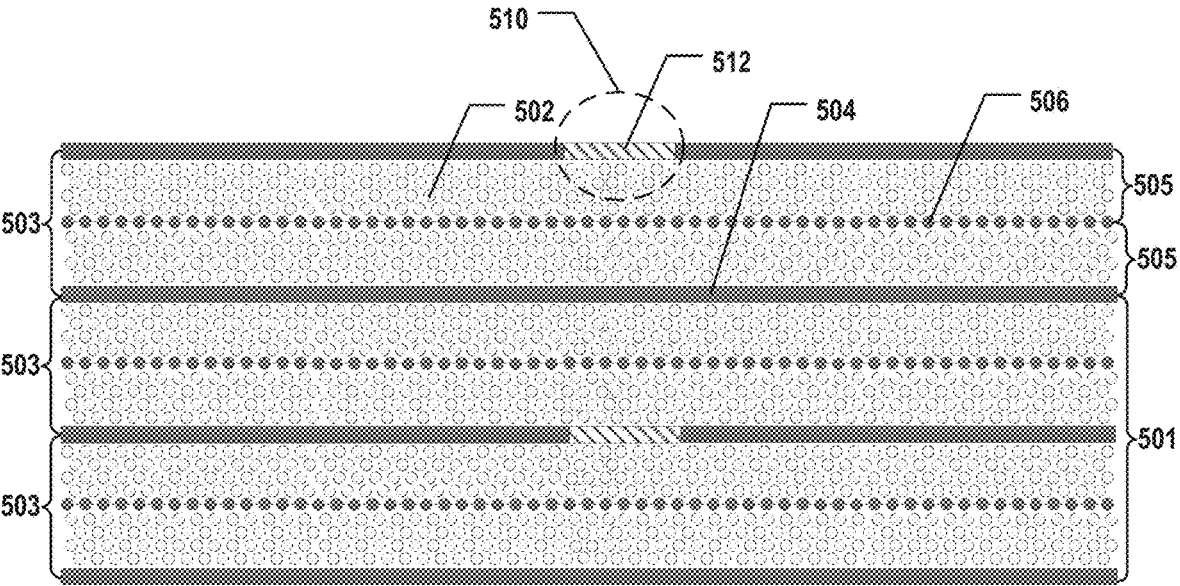
FIG. 5 illustrates a plan view of another 3D memory device having slit structures and cut structures, according to some aspects of the present disclosure.
Figure 5:

FIG. 5 illustrates a plan view of another 3D memory device 500 having slit structures 504, drain select gate (DSG) cut structures 506, and SSG cut structures 512, according to some aspects of the present disclosure. 3D memory device 500 may be one example of part of memory plane 102 in FIG. 1 that includes memory array structure 106 or part of memory plane 202 in FIG. 2 that includes memory array structure 206-1/206-2. As shown in FIG. 5, 3D memory device 500 can include an array of NAND memory strings each including a channel structure 502 and parallel slit structures 504 (e.g., GLSs) each including a dielectric spacer and extending in the x-direction (the bit line direction) to separate channel structures 502 into blocks 501 in the y-direction (the bit line direction). In some implementations in which 3D memory device 300 is a NAND Flash memory device, each block 501 is the smallest erasable unit of the NAND Flash memory device. That is, 3D memory device 500 can achieve "by block" control of memory cells during erase operations, such that data stored in all the memory cells in the same block 501 can be erased at once.

Within each block 302, one or more slit structures 504 have "H" cuts 510 that electrically connected channel structures 502 in the same block 501 during erase operations. Slit structures 504 with "H" cuts 510 within block 501 can further divide block 501 into fingers 503. In order to achieve "by finger" control of memory cells during read operations, SSG cut structures 512 can be formed aligned with and under "H" cuts 510 to cut off one or more SSG lines (i.e., one or more conductive layers at the bottom of the stack structure). In other words, slit structures 504 in conjunction with SSG cut structures 512 can separate the memory cells into fingers 503 in the y-direction (the bit line direction), which is the smallest readable unit of the NAND Flash memory device.

In some implementations, within each finger 503, DSG cut structures 506 can further separate the memory cells into strings 505 in the y-direction (the bit line direction), which is the smallest programmable (writable) unit of the NAND Flash memory device. In order to achieve "by string" control of memory cells during program operations, DSG cut structures 506 can cut off one or more DSG lines (i.e., one or more conductive layers at the top of the stack structure). Different from slit structures 504 each extending all the way through the stack structure to cut off all conductive layers (including all word lines, SSG line(s), and DSG line(s)), cut structures 506 and 512 extend through only part of the stack structure to cut off only some of the conductive layers, i.e., DSG line(s) and SSG line(s), respectively. The combination of slit structures 504 and cut structures 506 and 512 can enable control of memory cells at different scales (e.g., block 501, finger 503, or string 505) during different operations (e.g., erase, read, or program).

Figure 6:
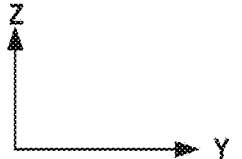
FIG. 6 illustrates a side view of a cross-section of a 3D memory device having a channel structure and cut structures, according to some aspects of the present disclosure.

FIG. 6 illustrates a side view of a cross-section of a 3D memory device 600 having a channel structure 611, DSG cut structures 624, and SSG cut structures 626, according to some aspects of the present disclosure. 3D memory device 600 may be an example of 3D memory device 500 in FIG. 5. As shown in FIG. 5, 3D memory device 600 can include a NAND memory string 610 that extends vertically through a memory stack 604 on a semiconductor layer 602. Semiconductor layer 602 can include a semiconductor material, such as silicon (e.g., single crystalline silicon or polysilicon), silicon germanium (SiGe), gallium arsenide (GaAs), germanium (Ge), silicon on insulator (SOI), germanium on insulator (GOI), or any other suitable materials. Consistent with the scope of the present disclosure, in some implementations, semiconductor layer 602 includes polysilicon doped with any suitable N-type dopants, such as phosphorus (P) or arsenic (As), i.e., N-type doped polysilicon layer. That is, semiconductor layer 602 can be an N-type doped polysilicon layer to enable a GIDL-assisted body bias when performing the GIDL erase operation.

Memory stack 604 can include interleaved gate conductive layers 606 and gate-to-gate dielectric layers 608. The number of the pairs of gate conductive layers 606 and gate-to-gate dielectric layers 608 in memory stack 604 can determine the number of memory cells in 3D memory device 600. Gate conductive layer 606 can include conductive materials including, but not limited to, tungsten (W), cobalt (Co), copper (Cu), aluminum (Al), polysilicon, doped silicon, silicides, or any combination thereof. In some implementations, each gate conductive layer 606 includes a metal layer, such as a W layer. In some implementations, each gate conductive layer 606 includes a doped polysilicon layer. Each gate conductive layer 606 can include control gates surrounding memory cells, the gates of DSG transistors, or the gates of SSG transistors, and can extend laterally as a DSG line 603 in the top portion of memory stack 604, an SSG line 605 in the bottom portion of memory stack 604, or a word line 601 in the middle portion of memory stack 604 between DSG line 603 and SSG line 605. It is understood that although one DSG line 603 and SSG line 605 are shown in FIG. 6, in some examples, memory stack 604 may include more than one DSG line (and more than one DSG transistors) and/or more than one SSG line (and more than one SSG transistor).

As shown in FIG. 6, NAND memory string 610 includes a channel structure 611 extending vertically through memory stack 604. In some implementations, channel structure 611 includes a channel hole filled with semiconductor material(s) (e.g., as a semiconductor channel 614) and dielectric material(s) (e.g., as a memory film 620). In some implementations, semiconductor channel 614 includes silicon, such as polysilicon. In some implementations, memory film 612 is a composite dielectric layer including a tunneling layer 620, a storage layer 618 (also known as a "charge trap/storage layer"), and a blocking layer 616. Channel structure 611 can have a cylinder shape (e.g., a pillar shape). Semiconductor channel 614, tunneling layer 620, storage layer 618, and blocking layer 616 are arranged radially from the center toward the outer surface of the pillar in this order, according to some implementations. Tunneling layer 620 can include silicon oxide, silicon oxynitride, or any combination thereof. Storage layer 618 can include silicon nitride, silicon oxynitride, silicon, or any combination thereof. Blocking layer 616 can include silicon oxide, silicon oxynitride, high dielectric constant (high-k) dielectrics, or any combination thereof. In one example, memory film 612 may include a composite layer of silicon oxide/silicon oxynitride/silicon oxide (ONO). Channel structure 611 can further include a channel plug 622 at the drain end thereof. Channel plug 622 can include polysilicon and be in contact with semiconductor channel 614.

As shown in FIG. 6, to enable GIDL erase operations, the source end (the end that is closer to the source than the drain) of semiconductor channel 614 of channel structure 611 is in contact with N-type doped semiconductor layer 602, according to some implementations. Parts of memory film 612 of channel structure 611 at the source end can be removed to expose semiconductor channel 614 to contact N-type doped semiconductor layer 602. In some implementations, part of semiconductor channel 614 at the source end of NAND memory string 610 is doped to form a doped region that is in contact with N-type doped semiconductor layer 602. In some implementations, N-type doped semiconductor layer 602, which is in contact with the source end of the channel structure 611 of NAND memory string 610, is configured to generate a GIDL-assisted body bias when performing GIDL erase operations. The GIDL generated at the source of NAND memory string 610 can generate hole current into semiconductor channel 614 of channel structure 611 to raise the body potential for erase operations. As a result, NAND memory string 610 in contact with N-type doped semiconductor layer 602 is configured to perform GIDL erase operations, according to some implementations.

As shown in FIG. 6, 3D memory device 600 can further include DSG cut structures 624 (e.g., corresponding to DSG cut structures 506 in FIG. 5) that extend vertically through and cut off DSG line 603 to enable "by string" control of the memory cells, for example, during program operations. Moreover, 3D memory device 600 can further include SSG cut structures 626 (e.g., corresponding to SSG cut structures 512 in FIG. 5) that extend vertically through and cut off SSG line 605 to enable "by finger" control of the memory cells, for example, during read operations to reduce the power consumption and/or read disturbance. As described above, regardless of the number of DSG lines or SSG lines, cut structures 624 or 626 can extend through and cut off each DSG line or SSG line. It is understood that the locations of cut structure 624 and 626 in the y-direction in FIG. 6 are for illustrative purposes only and may not represent the actual locations.

Consistent with the scope of the present disclosure, in some implementations, NAND memory string 610 of 3D memory device 600 performs GIDL erase operations, as opposed to P-well erase operations. As shown in FIG. 6, the source end of semiconductor channel 614 of channel structure 611 is in contact with N-type doped semiconductor layer 602, as opposed to a P-well, which serves as the source of the holes during erase operations. Accordingly, in some implementations, the bottom-most conductive layer 606 of memory stack 604 works as a GIDL line 607 for GIDL erase operation control. It is understood that similar to DSG line 603 and SSG line 605, the number of GIDL line 607 is not limited to one as shown in FIG. 6 and may be more than one in some examples. Each conductive layer, e.g., word line 601, DSG line 603, SSG line 605, or GIDL line 607 is electrically disconnected from one another, according to some implementations. Although SSG line 605 and GIDL line 607 are both in the bottom portion of memory stack 604, GIDL line 607 can be electrically disconnected from SSG line 605. As shown in FIG. 6, GIDL line 607 is below SSG line 605, according to some implementations. That is, GIDL line 607 can be disposed closer to semiconductor layer 602 and the source end of channel structure 611 than SSG line 605.

FIG. 6 shows part of 3D memory device 600 in the core array region thereof, e.g., the region in which memory array structure 106 or 206-1/206-2 is formed. In the core array region, as shown in FIG. 6, SSG cut structure 626 may not only extend through and cut off each SSG line 605, but also extend further through and cut off each GIDL line 607. As described above with respect to FIG. 5, SSG cut structure 626 may be formed under "H" cut 510 and may be replaced with slit structure 504 in other places.

Figure 7:
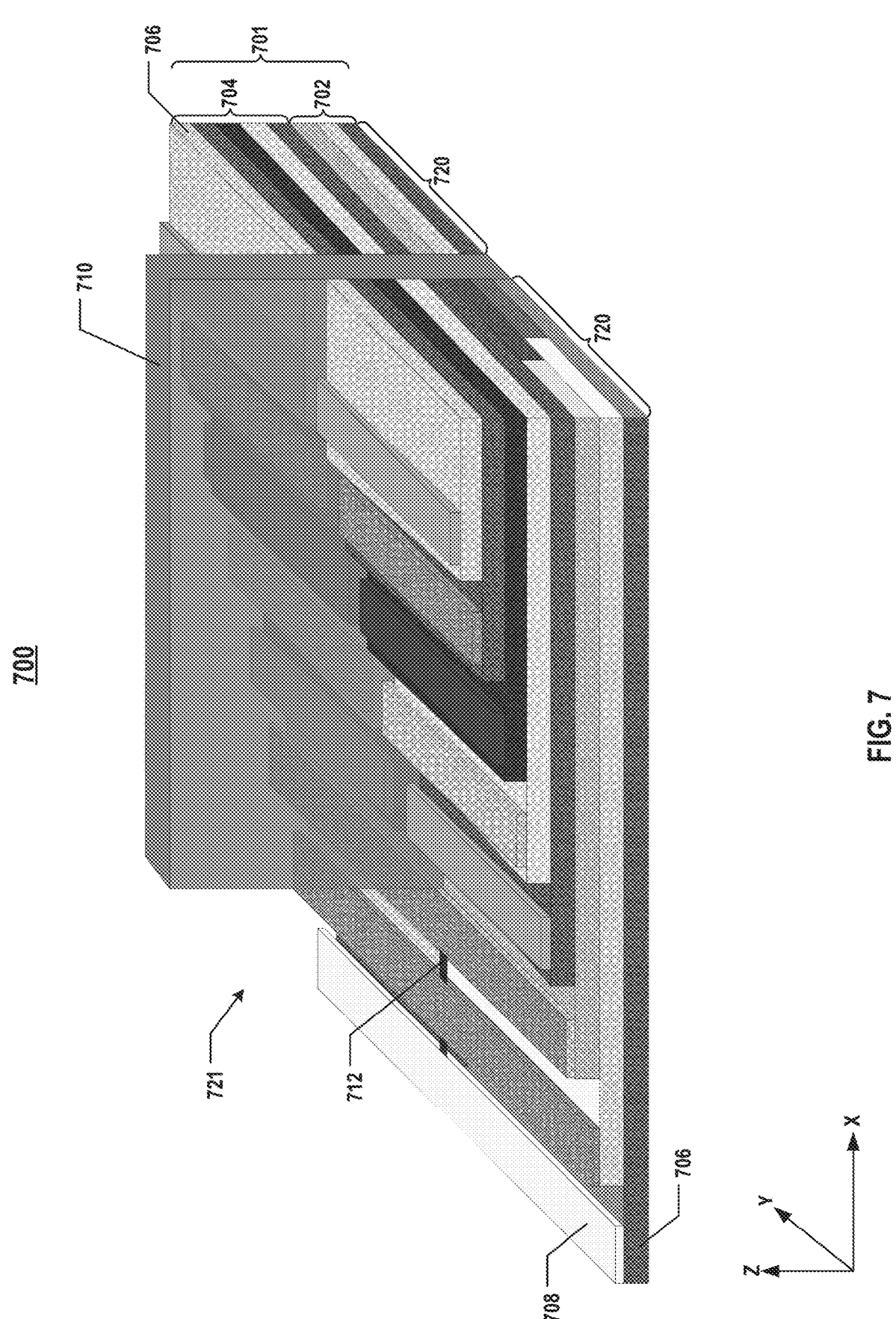
FIG. 7 illustrates a top perspective view of a 3D memory device having a staircase structure, according to some aspects of the present disclosure.
Figure 8A:
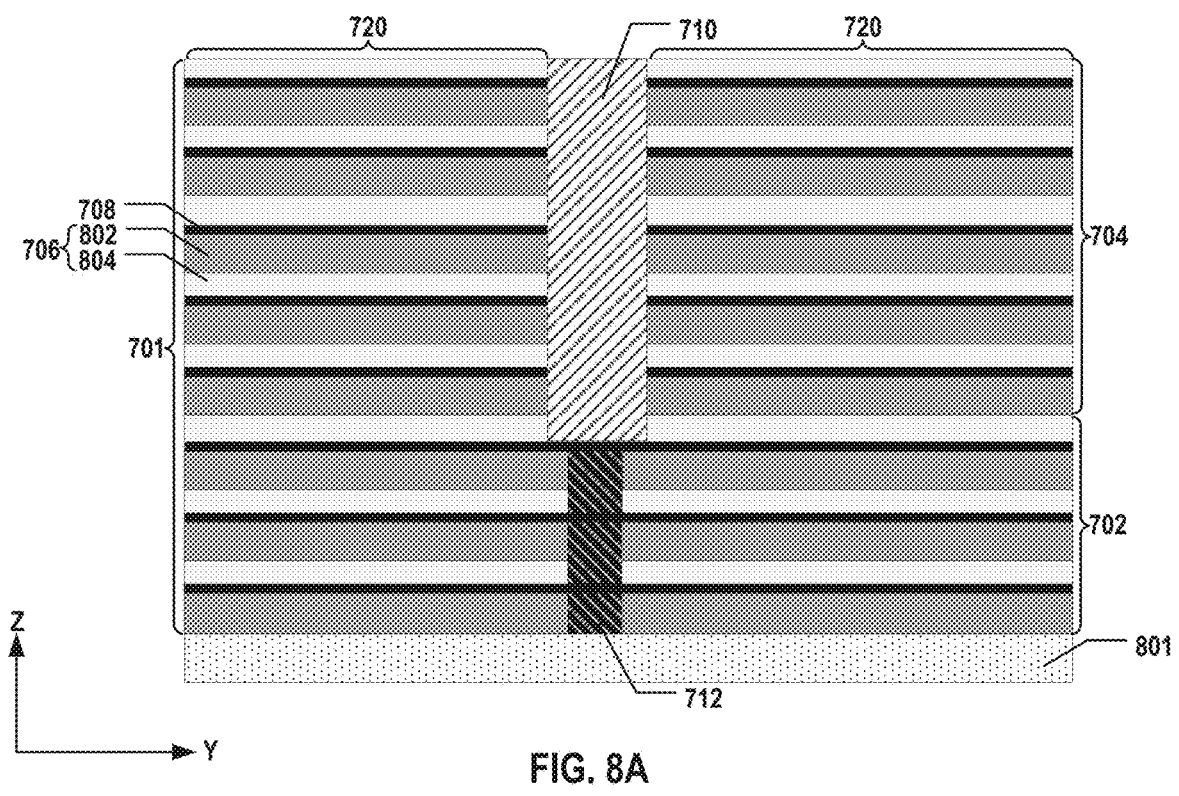
FIGS. 8A and 8B illustrate projection views of a 3D memory device having a staircase structure projected toward various directions onto various planes, according to some aspects of the present disclosure.
Figure 8B:
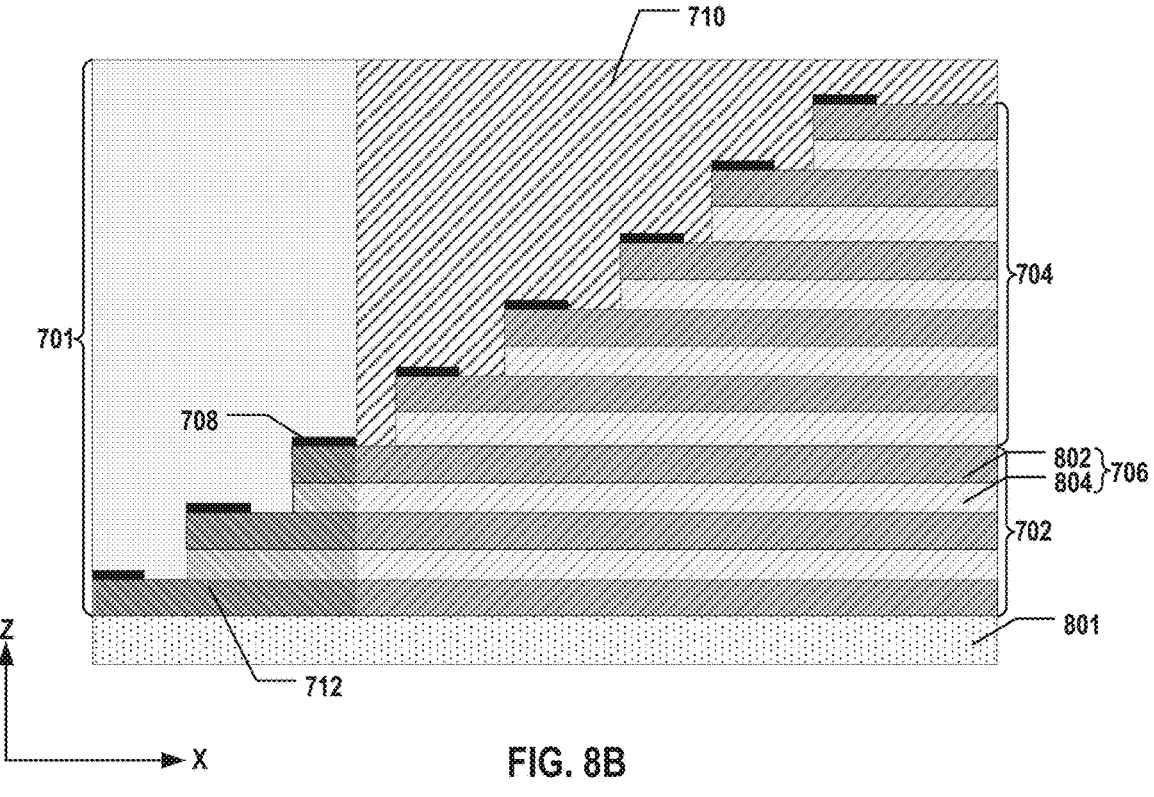

Consistent with the scope of the present disclosure, the design and arrangement of the gate conductive layers (e.g., word lines, SSG lines, and GIDL lines), the cut structures that cut off the bottom gate conductive layers (e.g., SSG lines and GIDL lines), as well as the slit structures in the staircase region in which staircase structures 104 or 204 are formed are different from those in the core array region, for example, shown in FIGS. 5 and 6 in order to enable "by block" control of GIDL erase operations and "by finger" control of read operations to reduce power consumption and read disturbance while maintaining the mechanical strength and stability of the slit structures without collapse. For example, FIG. 7 illustrates a top perspective view of a 3D memory device 700 having a staircase structure 721, according to some aspects of the present disclosure. FIGS. 8A and 8B illustrate projection views a 3D memory device (e.g., 3D memory device 700 in FIG. 7) having a staircase structure (e.g., staircase structure 721 in FIG. 7) projected toward various directions onto various planes, according to some aspects of the present disclosure. For example, FIG. 8A shows the projection views of 3D memory device 700 projected toward the positive x-direction onto the y-z plane, and FIG. 8B shows the projection view of 3D memory device 700 projected toward the positive y-direction onto the x-z plane. FIGS. 7, 8A, and 8B will be described below together.

As shown in FIGS. 7, 8A, and 8B, 3D memory device 700 can include a semiconductor layer 801 (e.g., an example of semiconductor layer 602 in FIG. 6) and a stack structure 701 (e.g., memory stack 604 in FIG. 6) on semiconductor layer 801. Although not shown, it is understood that 3D memory device 700 may include a plurality of channel structures (e.g., channel structures 611 in FIG. 6) in a core array region, and each channel structure may extend vertically through stack structure 701 to be in contact with semiconductor layer 801. In some implementations, to enable GIDL erase operation, semiconductor layer 801 is an N-type doped polysilicon layer, i.e., including polysilicon doped with N-type dopants, such as P or As. It is understood that in some examples, additional layer(s) (not shown), such as an oxide pad layer, may be formed vertically between stack structure 701 and semiconductor layer 801. Nevertheless, the channel structure can extend through those additional layer(s) (if any) to be in contact with semiconductor layer 801.

Stack structure 701 can include a plurality of pairs 706 each including a conductive layer 802 and a dielectric layer 804. That is, stack structure 701 includes interleaved conductive layers 802 and dielectric layers 804, according to some implementations. In some implementations, the edges of interleaved conductive layers 802 and dielectric layers 804 of stack structure 701 define staircase structure 721 having a plurality of stairs (levels) in the staircase region of 3D memory device 700. Each stair of staircase structure 721 can correspond to a respective pair 706 of conductive layer 802 and dielectric layer 804. It is understood that in some examples, each stair of staircase structure 721 may correspond to multiple pairs 706 of conductive layers 802 and dielectric layers 804. Nevertheless, in some implementations, conductive layer(s) 802 and dielectric layer(s) 804 of the same level have the same lateral dimension in the x-direction (the word line direction), while conductive layers 802 in different levels have different lateral dimensions in the x-direction (the word line direction). In some implementations, the lateral dimension in the x-direction of a conductive layer 802 that is closer to semiconductor layer 801 (i.e., the source end of the channel structure) is greater than that of another conductive layer that is farther away from semiconductor layer 801 (i.e., the source end of the channel structure).

As described above with respect to FIG. 6, in some implementations, a set of conductive layer(s) 802 that is closest to semiconductor layer 801 (i.e., the source end of the channel structure) function as a set of GIDL line(s) 702 (e.g., corresponding to GIDL line 607) for "by block" GIDL erase operation control, and another set of conductive layer (s) 802 right above GIDL line(s) 702 function as a set of SSG line(s) 704 (e.g., corresponding to SSG line 605) for "by finger" read operation control. Accordingly, each GIDL line 702 can be closer to semiconductor layer 801 (i.e., the source end of the channel structure) than any SSG line 704, and the dimension of each GIDL line 702 in the x-direction can be greater than the dimension of any SSG line 704 in the x-direction. GIDL line 702 is electrically disconnected from SSG line 704, according to some implementations. It is understood that FIGS. 7, 8A, and 8B only illustrates some pairs 706 of conductive layers 802 and dielectric layers 804 (e.g., conductive layers 802 functioning as GIDL lines 702 and SSG lines 704), and stack structure 701 may include additional pairs 706 of conductive layers 802 and dielectric layers 804 further away from semiconductor layer 801 (e.g., conductive layers 802 functioning as the word lines and DSG lines).

As shown in FIGS. 7, 8A, and 8B, to increase the thickness of conductive layer 802 in staircase structure 721 and reduce the risk that a word line contact (not shown) may penetrate through the corresponding conductive layer 802, 3D memory device 700 can further include contact landing layers 708 each disposed on a respective one of conductive layers 802 in staircase structure 721 and extending along the y-direction (the bit line direction). That is, at the end of each stair in each x-direction (the word line direction) where the word line contact land (i.e., the landing area), a respective contact landing layer 708 can be formed on conductive layer 802. As described below in detail with respect to the fabrication processes, contact landing layer 708 and conductive layer 802 can be formed in the same process and include the same conductive materials, such as the same metal (e.g., W). As a result, the thickness of the conductive material can be increased at the landing area in each level of stack structure 701. In some implementations, contact landing layer 708 extends laterally in the y-direction (the bit line direction) and has the same dimension as conductive layer 802 in the y-direction.

Since contact landing layers 708 and conductive layers 802 can be formed in the same process and have the same material, each contact landing layer 708 can be viewed as part of the respective conductive layer 802 in staircase structure 721 that is elevated from the rest of the respective conductive layer 802. In other words, each conductive layer 802 can include a thickened portion in staircase structure 721 to increase the thickness of conductive layer 802 in staircase structure 721. For ease of description, the terms "thickened portion of conductive layer" and "contact landing layer on conductive layer" are used interchangeably in the present disclosure. For example, thickened portion 708 of conductive layer 802 may also refer to contact landing layer 708 on conductive layer 802.

In some implementations, within each block, 3D memory device 700 further includes a slit structure 710 (e.g., corresponding to slit structure 308 or 504 in FIG. 3 or 5) extending vertically through stack structure 701 to be in contact with semiconductor layer 801. Although not shown in FIG. 7, it is understood that 3D memory device 700 may include multiple parallel slit structures 710 each extending vertically through each pair 706 of conductive layer 802 (e.g., each DSG line, word line, SSG line 704, or GIDL line 702) and dielectric layer 804 of stack structure 701 to reach semiconductor layer 801. In some implementations, slit structure 710 includes a spacer (not shown) having dielectric materials such as silicon oxide, silicon oxynitride, high-k dielectrics, or any combination thereof, to be electrically insulated from conductive layers 802. In some implementations, slit structure 710 further includes a source contact (not shown) in contact with semiconductor layer 801 and surrounded by the spacer. The source contact can include conductive materials, such as W, Co, Cu, Al, polysilicon, doped silicon, silicides, or any combination thereof, to make an electrical connection with the source end of the channel structure through semiconductor layer 801. The source contact can be electrically disconnected from conductive layers 802 (e.g., DSG line, word line, SSG line 704, and GIDL line 702) by the spacer. It is understood that in some examples, slit structure 710 may include only the spacer (having one or more dielectric materials) without a source contact. In some implementations, slit structure 710 also extends laterally in the x-direction (the word line direction). As shown in FIGS. 7A, 8A, and 8B, as slit structure 710 extends into slit structure 710 in the staircase region, contact landing layers 708 at some stairs (on some conductive layers 802) are cut off by slit structure 710 from the x-direction (the word line direction) into separate portions in different fingers 720, according to some implementations.

The more slit structure 710 extends laterally toward the end of staircase structure 721, the more contact landing layers 708 are cut off by slit structure 710, according to some implementations, as shown in FIGS. 7A and 8B. Consistent with the scope of the present disclosure, slit structure 710 can extend laterally along the x-direction (the word line direction), such that slit structure 710 cuts off at least one, but not all, of contact landing layers 708. In some implementations, slit structure 710 extends to a certain degree (not reaching the end of slit structure 710 in the x-direction) to cut off contact landing layers 708 on each DSG line (not shown), word line (not shown), and SSG line 704, but not contact landing layer(s) 708 on any GIDL line 702. As a result, within each block, contact landing layer 708 on each GIDL line 702 is continuous along the y-direction (the bit line direction) across different fingers 720, while contact landing layer 708 on each SSG line 704 is discontinuous along the y-direction (the bit line direction) in different fingers 720, according to some implementations. In other words, contact landing layer 708 on each GIDL line 702 can be spaced apart from the slit structure in the x-direction (the word line direction), while contact landing layer 708 on each SSG line 704 can be cut off by slit structure 710 from the x-direction (the word line direction) into separate portions in different fingers 720.

Since slit structure 710 is a long structure extending laterally between the core array region and the staircase region, the mechanical stability of slit structure 710 can be reduced as the length of slit structure 710 increases due to the higher stress thereof, thereby increasing the risk of collapse. By shortening the lateral extension of slit structure 710 from the end of slit structure 710, the lateral dimension of slit structure 710 in the –direction (the word line direction) can be reduced to reduce the stress, increase the mechanical stability, and reduce the risk of collapse, On the other hand, by carefully controlling the degree of lateral extension of slit structure 710, contact landing layers 708 on some conductive layers 802 that are needed for "by finger control," such as SSG lines 704 can still be cut off between fingers 720 by slit structure 710, the remaining contact landing layers 708 on other conductive layers 802 (e.g., GIDL lines 702) can remain intact (e.g., not cut off by slit structure 710 from the x-direction) since those conductive layers 802 (e.g., GIDL lines 702) are not used for "by finger"

control and do not need to be separated into fingers 720. For example, GIDL lines 702 may be used for "by block" control of GIDL erase operations, and each GIDL line 702 across different fingers 720 in the same block may be simultaneously controlled during GIDL erase operations, as described above. As a result, both "by finger" control and "by block" control of different operations can be achieved with the shortened slit structure 710 as well.

In some implementations, 3D memory device 700 further includes a cut structure 712 (e.g., corresponding to the counterpart of SSG cut structure 626 in the staircase case region) extending vertically through one or more pairs 706 of conductive layers 802 (e.g., GIDL lines 702) and dielectric layers 804. That is, cut structure 712 in staircase structure 721 can extend vertically through each GIDL line 702. Due to the fabrication process as described below in detail, cut structure 712 stops at contact landing layer 708 on each GIDL line 702 and thus, does not cut off contact landing layer 708, according to some implementations. Thus, neither slit structure 710 nor cut structure 712 cuts off contact landing layer 708 on each GIDL line 702 from the x-direction (the word line direction). In other words, contact landing layer 708 on each GIDL line 702 can remain continuous along the y-direction (the bit line direction) across different fingers 720 even with the presence of cut structure 712. As a result, although each GIDL line 702 may be cut off by cut structure 712 from the x-direction (the word line direction) into separate portions in different fingers 720, each GIDL line 702 within the same block can still be electrically connected among different fingers 720 by continuous contact landing layer 708 formed thereon.

Figure 9A:
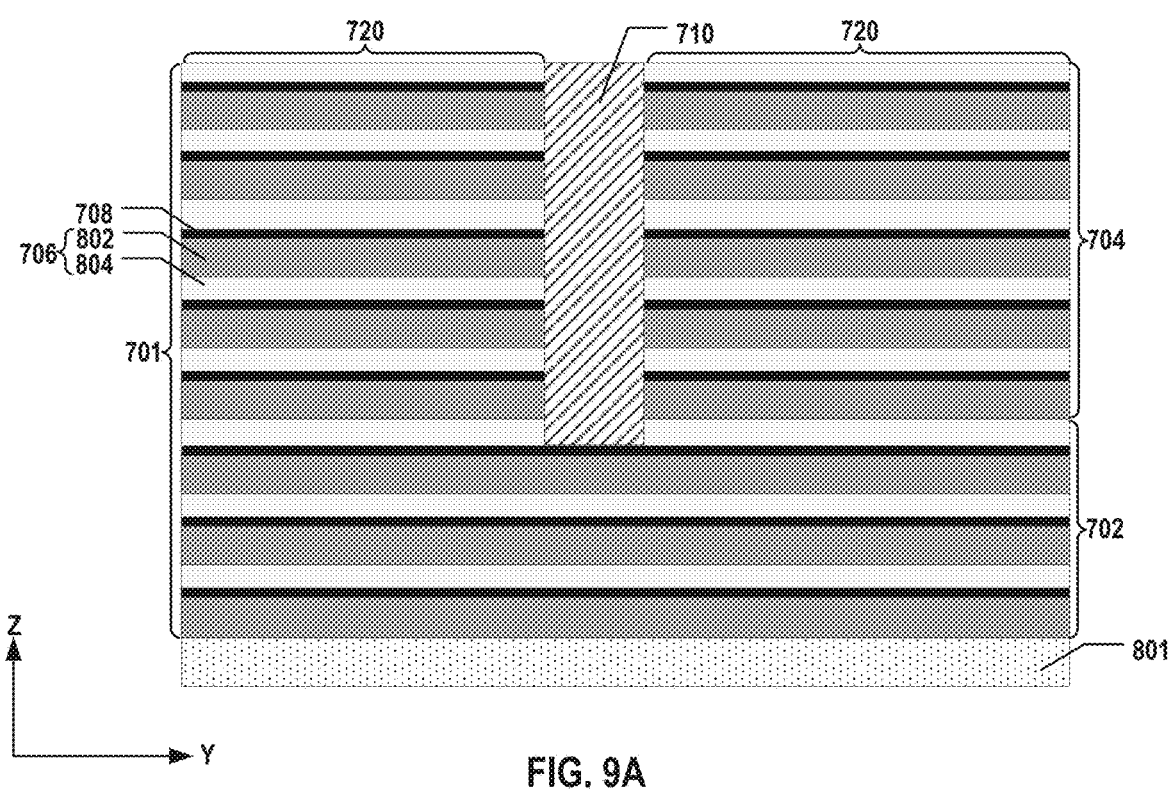
FIGS. 9A and 9B illustrate projection views in various directions of another 3D memory device having a staircase structure, according to some aspects of the present disclosure.
Figure 9B:
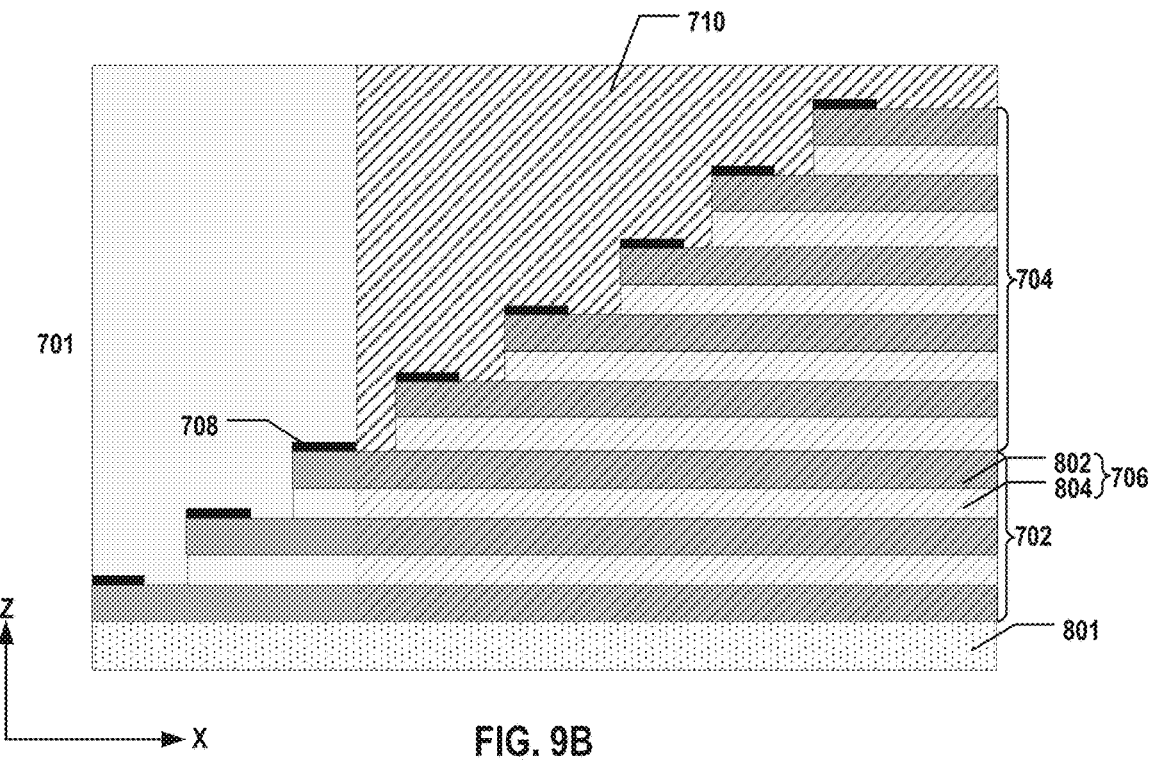

It is understood that in some examples, cut structure 712 may not be formed in staircase structure 721 in the staircase region (while its counterpart may still be formed in the core array region as shown in FIG. 6). For example, as shown in FIGS. 9A and 9B, without the presence of cut structure 712 (shown in FIGS. 7A, 8A, and 8B) in staircase structure 721 in the staircase region, not only contact landing layer 708, but also GIDL line 702 is continuous along the y-direction (the bit line direction) across different fingers 720.

FIG. 13 illustrates a block diagram of an exemplary system 1300 having a 3D memory device, according to some aspects of the present disclosure. System 1300 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 13, system 1300 can include a host 1308 and a memory system 1302 having one or more 3D memory devices 1304 and a memory controller 1306. Host 1308 can be a processor of an electronic device, such as a central processing unit (CPU), or a system-on-chip (SoC), such as an application processor (AP). Host 1308 can be configured to send or receive data to or from 3D memory devices 1304.

3D memory device 1304 can be any 3D memory device disclosed herein, such as 3D memory devices 100, 200, 300, 500, 600, and 700 depicted in FIGS. 1-7, 8A, 8B, 9A, and 9B. In some implementations, each 3D memory device 1304 includes a NAND Flash memory. Consistent with the scope of the present disclosure, contact landing layers are each disposed on a respective one of the conductive layers in the staircase structure and extending along the bit line direction, and a slit structure extends through the stack structure and along the word line direction, In some implementations, at least the contact landing layer on a first conductive layer (e.g., the GIDL line) is continuous along the bit line direction and spaced apart from the slit structure in the word line direction, while at least the contact landing layer on a second conductive layer (e.g., the SSG line) is discontinuous along the bit line direction and cut off by the slit structure from the word line direction. As a result, 3D memory device 1304 can achieve "by block" control of GIDL erase operations and "by finger" control of read operations to reduce power consumption and read disturbance while maintaining the mechanical strength and stability of the slit structures without collapse.

Memory controller 1306 (a.k.a., a controller circuit) is coupled to 3D memory device 1304 and host 1308 and is configured to control 3D memory device 1304, according to some implementations. For example, memory controller 1306 may be configured to control operations of the channel structure via the first conductive layer (e.g., the GIDL line) and the second conductive layer (e.g., the SSG line). In one example, memory controller 1306 may be configured to control GIDL erase operations of the channel structure via the GIDL line. In another example, memory controller 1306 may be configured to control read operations of the channel structure via the SSG line.

Memory controller 1306 can manage the data stored in 3D memory device 1304 and communicate with host 1308. In some implementations, memory controller 1306 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 1306 is designed for operating in a high duty-cycle environment SSDs or embedded multi-media-cards (eMMCs) used as data storage for mobile devices, such as smartphones, tablets, laptop computers, etc., and enterprise storage arrays. Memory controller 1306 can be configured to control operations of 3D memory device 1304, such as read, erase, and program operations. Memory controller 1306 can also be configured to manage various functions with respect to the data stored or to be stored in 3D memory device 1304 including, but not limited to bad-block management, garbage collection, logical-to-physical address conversion, wear leveling, etc. In some implementations, memory controller 1306 is further configured to process error correction codes (ECCs) with respect to the data read from or written to 3D memory device 1304. Any other suitable functions may be performed by memory controller 1306 as well, for example, formatting 3D memory device 1304. Memory controller 1306 can communicate with an external device (e.g., host 1308) according to a particular communication protocol. For example, memory controller 1306 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Memory controller 1306 and one or more 3D memory devices 1304 can be integrated into various types of storage devices, for example, be included in the same package, such as a universal Flash storage (UFS) package or an eMMC package. That is, memory system 1302 can be implemented and packaged into different types of end electronic products. In one example as shown in FIG. 14A, memory controller 1306 and a single 3D memory device 1304 may be integrated into a memory card 1402. Memory card 1402 can include a PC card (PCMCIA, personal computer memory card international association), a CF card, a smart media (SM) card, a memory stick, a multimedia card (MMC, MMCmicro), an SD card (SD, miniSD, microSD, SDHC), a UFS, etc. Memory card 1402 can further include a memory card connector 1404 electrically coupling memory card 1402 with a host (e.g., host 1308 in FIG. 13). In another example as shown in FIG. 14B, memory controller 1306 and multiple 3D memory devices 1304 may be integrated into an SSD 1406. SSD 1406 can further include an SSD connector 1408 electrically coupling SSD 1406 with a host (e.g., host 1308 in FIG. 13). In some implementations, the storage capacity and/or the operation speed of SSD 1406 is greater than those of memory card 1402.

Figure 12:
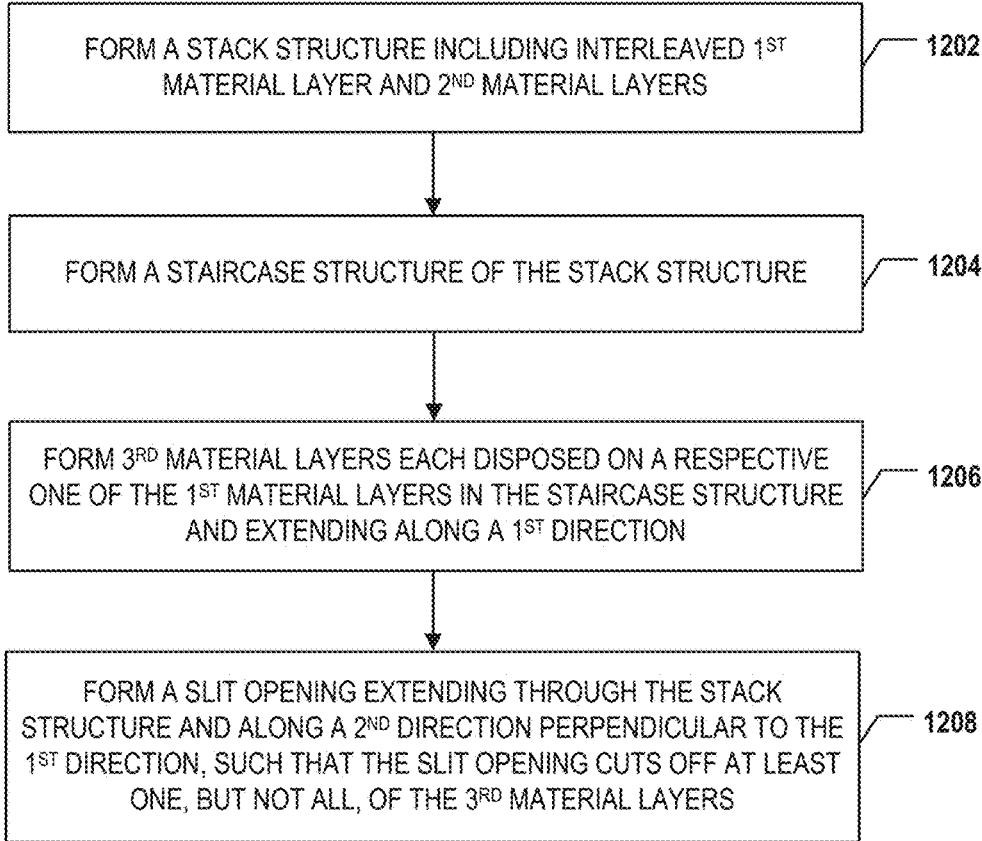
FIG. 12 is a flowchart of a method for forming a 3D memory device having a staircase structure, according to some aspects of the present disclosure.

FIGS. 10A-10G illustrate a fabrication process for forming an exemplary 3D memory device having a staircase structure, according to some aspects of the present disclosure. FIG. 12 illustrates a flowchart of a method 1200 for forming an exemplary 3D memory device having a staircase structure, according to some implementations of the present disclosure. Examples of the 3D memory device depicted in FIGS. 10A-10G and 12 include 3D memory device 700 depicted in FIGS. 7, 8A, and 8B. FIGS. 10A-10G and 12 will be described together. It is understood that the operations shown in method 1200 are not exhaustive and that other operations can be performed as well before, after, or between any of the illustrated operations. Further, some of the operations may be performed simultaneously, or in a different order than shown in FIG. 12.

Referring to FIG. 12, method 1200 starts at operation 1202, in which a stack structure including interleaved first material layers and second material layers is formed. In some implementations, a semiconductor layer is formed, such that the stack structure is formed on the semiconductor layer. The semiconductor layer can be doped with an N-type dopant. To form the stack structure, a first layer of the first material layers is formed, and a second layer of the first material layers is formed above the first layer of the first material layers.

Figure 10A:
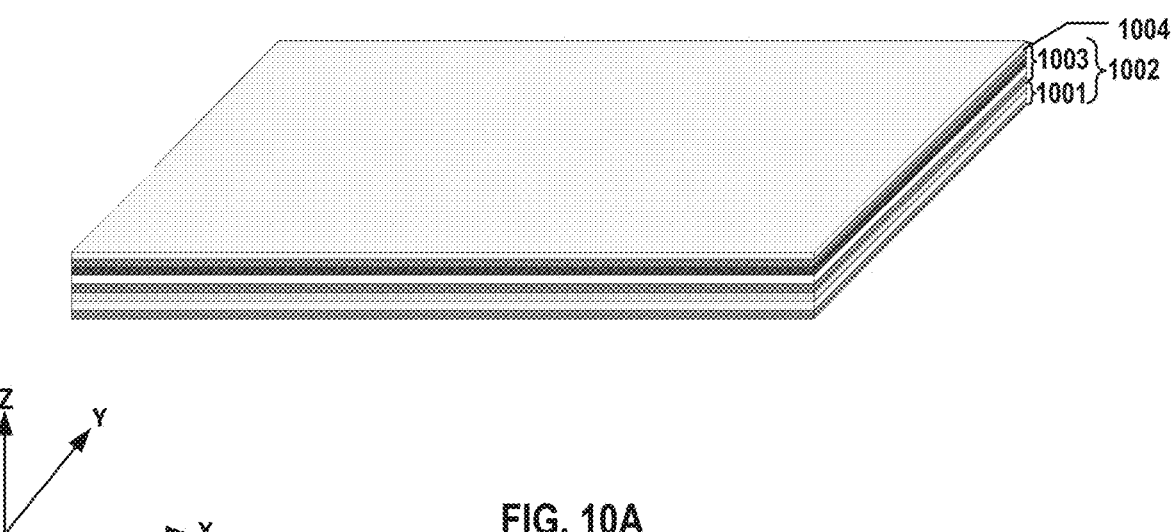
FIGS. 10A-10G illustrate a fabrication process for forming a 3D memory device having a staircase structure, according to some aspects of the present disclosure.

As illustrated in FIG. 10A, a stack structure 1002, e.g., a dielectric stack, including a plurality of dielectric layer pairs 1004 is formed. Each dielectric layer pair 1004 can include a first dielectric layer (i.e., a sacrificial layer) and a second dielectric layer having a different dielectric material from the sacrificial layer. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, chemical vapor deposition (CVD), physical vapor deposition (PVD), atomic layer deposition (ALD), or any combination thereof. In one example, silicon oxide and silicon nitride may be alternatingly deposited on a semiconductor layer (not shown). In another example, silicon oxide and silicon nitride may be first alternatingly deposited on a sacrificial layer (not shown), which may be later removed and replaced with a semiconductor layer. The semiconductor layer can be a deposited polysilicon layer. In some implementations, the polysilicon layer is doped with N-type dopant(s), such as P or As, using ion implantation and/or thermal diffusion. In some implementations, to form the N-type doped polysilicon layer, in-situ doping of N-type dopant(s), such as P or As, is performed when depositing polysilicon. To form stack structure 1002, a first set 1001 of dielectric layer pairs 1004 from which the GIDL lines are formed can be deposited first, and a second set 1003 of dielectric layer pairs 1004 from which the SSG lines are formed can be deposited above first set 1001.

It is understood that in some examples, a pad oxide layer (e.g., thermally grown local oxidation of silicon (LOCOS)) including silicon oxide may be formed between stack structure 1002 and the semiconductor layer or the sacrificial layer. It is also understood that in some examples, stack structure 1002 may be a memory stack including interleaved conductive layers (as opposed to the sacrificial layers) and dielectric layers. The memory stack may be formed by alternatingly depositing conductive layers (e.g., doped polysilicon layers) and dielectric layers (e.g., silicon oxide layers) on the semiconductor layer or the sacrificial layer.

Figure 10B:
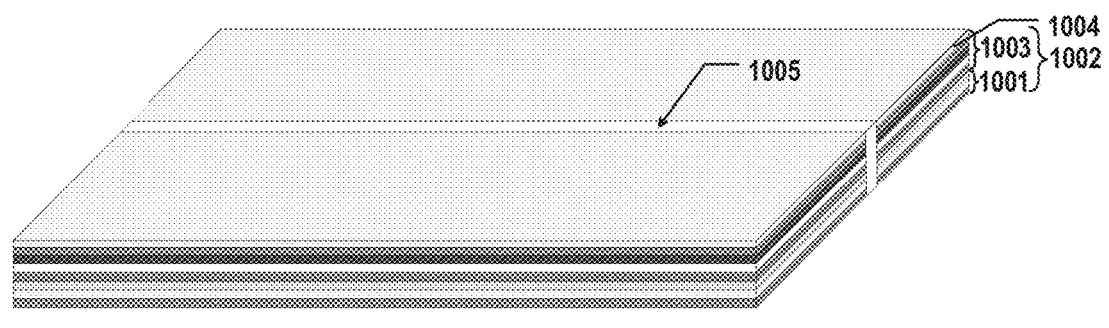
Figure 10B:
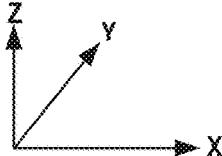
Figure 10C:
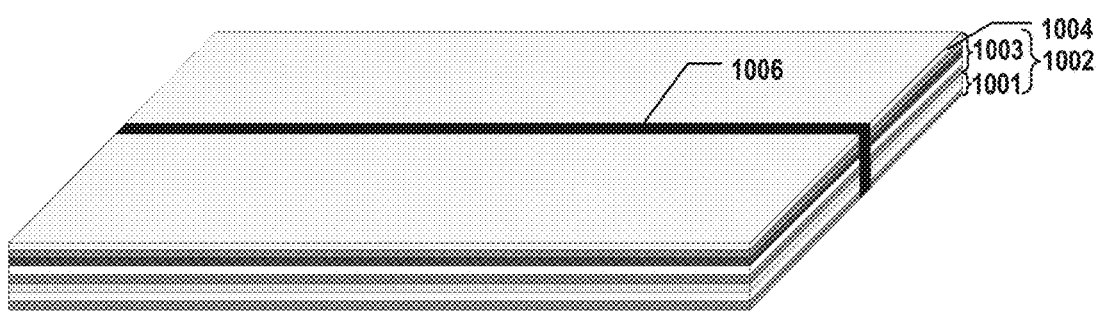
Figure 10C:
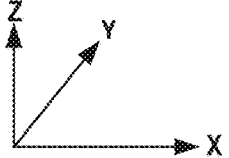

In some implementations, a cut structure extending through the first layer of the first material layers and the second layer of the first material layers is formed. As illustrated in FIG. 10B, a trench opening 1005 extending vertically through first and second sets 1001 and 1003 of dielectric layer pairs 1004 of stack structure 1002 is formed, for example, using wet etching and/or dry etching, such as reactive ion etch (RIE). As illustrated in FIG. 10C, cut structure 1006 extending vertically through first and second sets 1001 and 1003 of dielectric layer pairs 1004 of stack structure 1002 is formed, for example, by filling trench opening 1005 (shown in FIG. 10C) with a spacer. In some implementations, one or more dielectric materials, such as silicon oxide, is deposited using CVD, PVD, ALD, or any combination thereof, to fill trench opening 1005, followed by a planarization process, such as chemical mechanical polishing (CMP), to remove the excessive dielectric materials.

In some implementations, after the formation of the cut structure, additional interleaved first material layers and second material layers are formed above the second layer of the first material layers to further form the stack structure. Although not shown, it is understood that in some examples, additional sets of dielectric layer pairs 1004 from which the word lines and DSG lines are formed may be formed on second set 1003 of dielectric layer pairs 1004 and cut structure 1006 (shown in FIG. 10C) by alternatingly depositing two different dielectric materials, such as silicon oxide and silicon nitride, using one or more thin film deposition processes, such as CVD, PVD, ALD, or any combination thereof.

Figure 10D:
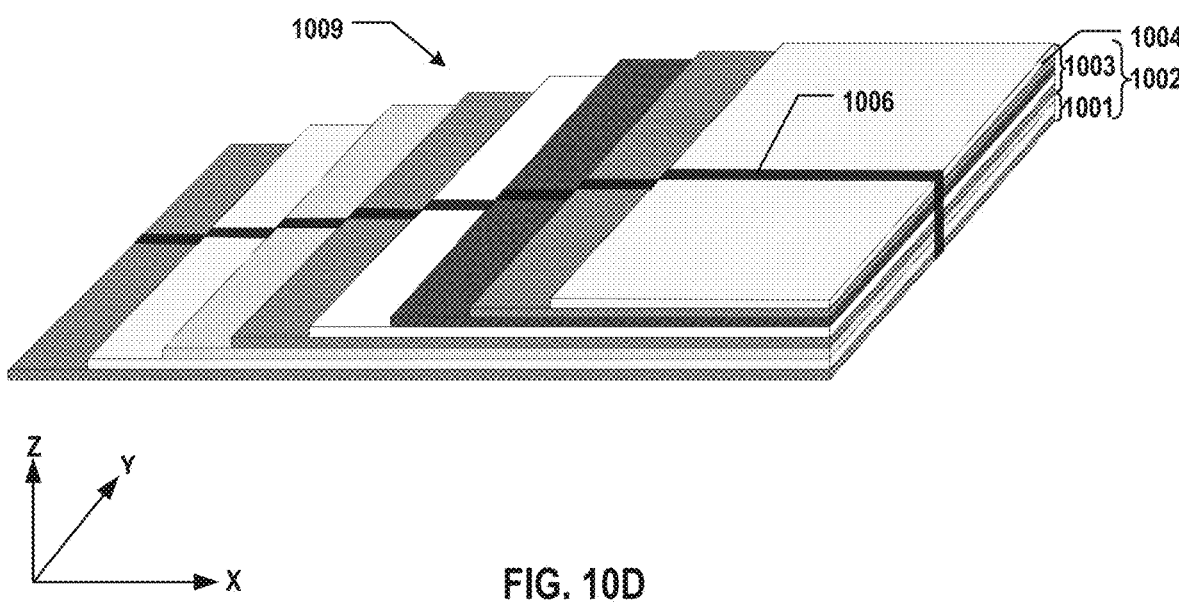

Method 1200 proceeds to operation 1204, as illustrated in FIG. 12, in which a staircase structure of the stack structure is formed. As illustrated in FIG. 10D, a staircase structure 1009 is formed in a staircase region of stack structure 1002, which can be either in the intermediate (e.g., in 3D memory device 200) or on two sides (e.g., in 3D memory device 100) of stack structure 1002. Staircase structure 1009 can be formed by performing a plurality of so-called "trim-etch" cycles to dielectric layer pairs 1004 of stack structure 1002 toward the semiconductor layer or the sacrificial layer. Due to the repeated trim-etch cycles applied to the dielectric layer pairs 1004 of dielectric stack 1002, stack structure 1002 can have one or more tilted edges and an upper dielectric layer pair 1004 shorter than the lower one as shown in FIG.

Method 1200 proceeds to operation 1206, as illustrated in FIG. 12, in which third material layers each disposed on a respective one of the first material layers in the staircase structure and extending along a first direction are formed. The first and third material layers can include the same dielectric material.

Figure 10E:
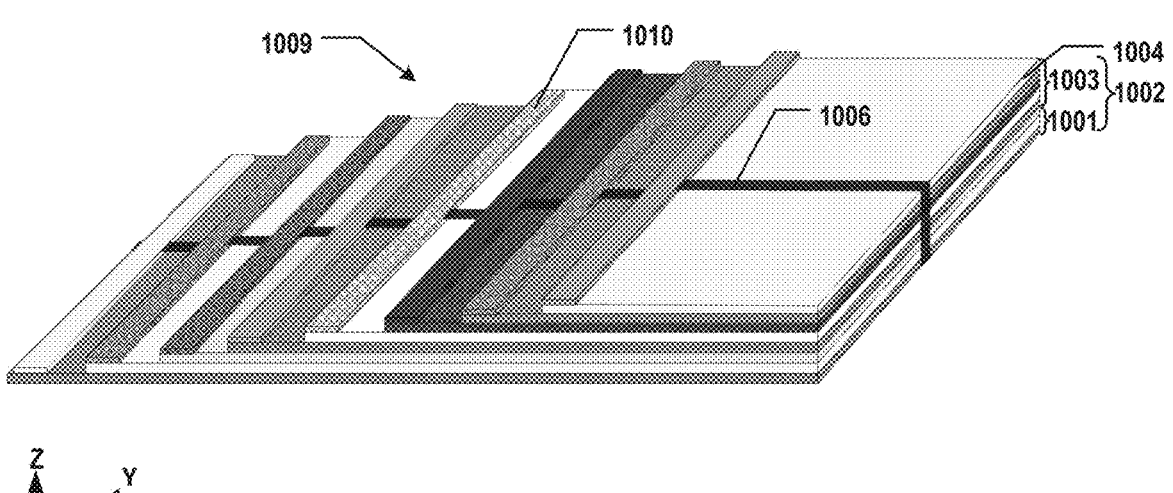
Figure 10E:
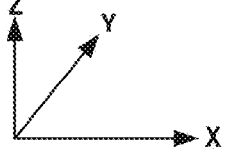

As illustrated in FIG. 10E, sacrificial layers 1010 are each formed on a respective one of sacrificial layers of dielectric layer pairs 1004 in staircase structure 1009. Each sacrificial layer 1010 can be patterned to extend along the y-direction (the bit line direction) and have the same dimension in the y-direction as the underneath sacrificial layers of dielectric layer pair 1004. Sacrificial layers 1008 can have the same dielectric material as the sacrificial layer of dielectric layers pairs 1004, such as silicon nitride. To form sacrificial layers 1008, a dielectric material, such as silicon nitride, can be deposited on staircase structure 1009 using one or more thin film deposition processes, such as CVD, PVD, ALD, or any combination thereof. The deposited dielectric material can then be aligned and patterned using lithography and dry etching and/or wet etching to form sacrificial layers 1008 on top of the end of each dielectric layer pair 1004. Since sacrificial layers 1008 are formed after the formation of cut structure 1006, cut structure 1006 does not extend vertically through sacrificial layers 1008, according to some implementations, as shown in FIG. 10E. It is understood that in some examples in which stack structure 1002 is a memory stack, sacrificial layers 1010 may become conductive layers (contact landing layers) having the same conductive material as the conductive layers of the memory stack.

Method 1200 proceeds to operation 1208, as illustrated in FIG. 12, in which a slit opening extending through the stack structure and along a second direction perpendicular to the first direction is formed, such that the slit opening cuts off at least one, but not all, of the third material layers. In some implementations, the third material layer on the first layer of the first material layers is spaced apart from the slit structure in the second direction, and the third material layer on the second layer of the first material layers is cut off by the slit opening from the second direction. In some implementations, to form the slit opening, the slit opening extending through the stack structure is etched. In some implementations, a spacer is deposited into the slit opening to form a slit structure. In some implementations, the slit opening is aligned with the cut structure in the first direction, such that the slit opening cuts part of the cut structure extending through the second layer of the first material layers. In some implementations, prior to depositing the spacer, the first material layers and the third material layers are replaced with conductive layers through the slit opening. Each one of the conductive layers has a thickened portion (e.g., a contact landing layer) in the staircase structure.

Figure 10F:
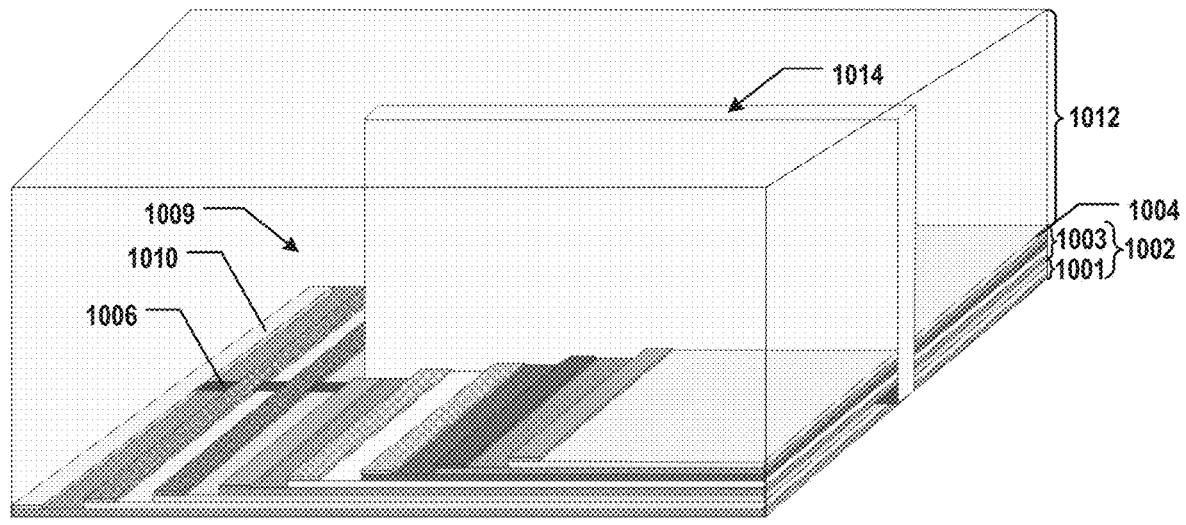
Figure 10F:
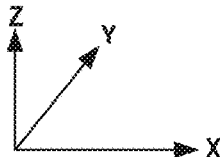

As illustrated in FIG. 10F, a dielectric layer 1012 is formed on stack structure 1002 and sacrificial layers 1010, and a slit opening 1014 extending through dielectric layer 1012 and stack structure 1002 is formed. In some implementations, a dielectric material, such as silicon oxide, is deposited on stack structure 1002 and sacrificial layers 1010, covering staircase structure 1009 using one or more thin film deposition processes, such as CVD, PVD, ALD, or any combination thereof, to form dielectric layer 1012. An etch mask (not shown) for etching slit opening 1014 can then be patterned using lithography and etching to be aligned with cut structure 1006 in the y-direction (the bit line direction). As shown in FIG. 10F, the etch mask for etching slit opening 1014 can be further patterned to extend laterally along the x-direction (the word line direction) to a degree that overlies part of cut structure 1006 extending through second set 1003 of dielectric layer pairs 1004, but not the other part of cut structure 1006 extending through first set 1001 of dielectric layer pairs 1004. Slit opening 1014 can then be etched through dielectric layer 1012 and stack structure 1002 by dry etching and/or wet etching, such as deep RIE (DRIE), using the patterned etch mask. As a result, slit opening 1014 can remove the part of cut structure 1006 extending through first set 1001 of dielectric layer pairs 1004, leaving the remainder of cut structure 1006 extending through first set 1001 of dielectric layer pairs 1004 intact. Slit opening 1014 can also extend through and cut off sacrificial layers 1010 on second set 1003 of dielectric layer pairs 1004, while leaving sacrificial layers 1010 on first set 1001 of dielectric layer pairs 1004 intact. That is, sacrificial layers 1010 on first set 1001 of dielectric layer pairs 1004 are spaced apart from slit opening 1014 in the x-direction, and sacrificial layers 1010 on second set 1003 of dielectric layer pairs 1004 are cut off by slit opening 1014 from the x-direction, according to some implementations.

Figure 10G:
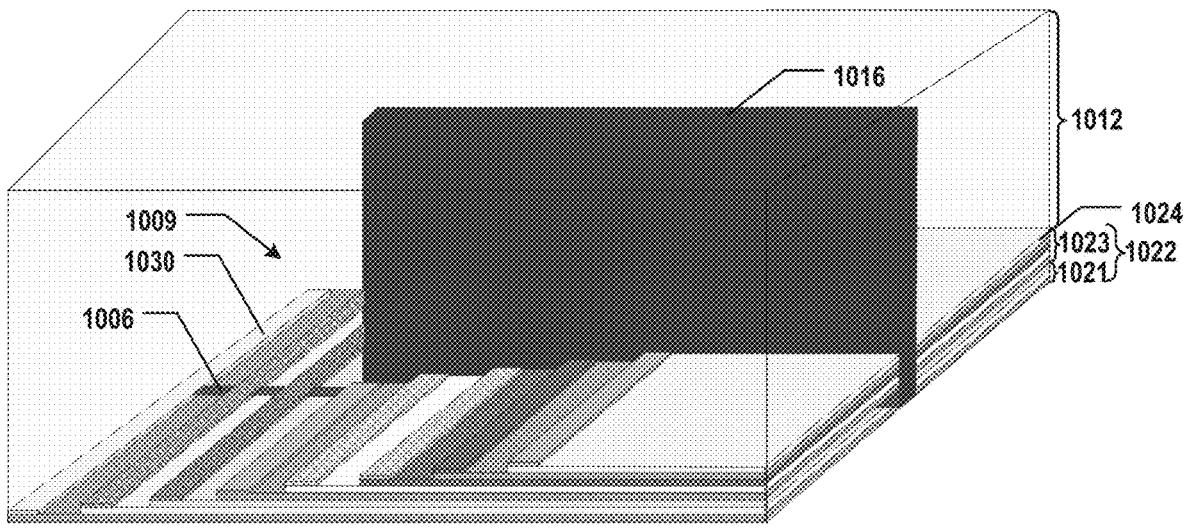
Figure 10G:
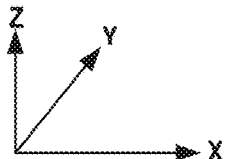

As illustrated in FIG. 10G, stack structure 1002 (e.g., dielectric stack) is replaced with a stack structure 1022 (e.g., a memory stack) including pairs 1024 of conductive layers and the dielectric layers using a gate-replacement process. The gate-replacement process can include removing the sacrificial layers of dielectric layer pairs 1004 (shown in FIG. 10F) and later-deposited sacrificial layers 1010, for example, by applying an etchant (e.g., phosphoric acid for silicon nitride) through slit opening 1014 (shown in FIG. 10F) to selectively etch away the sacrificial layers of dielectric layer pairs 1004 and later-deposited sacrificial layers 1010 (e.g., having silicon nitride) without etching dielectric layers (e.g., having silicon oxide) of dielectric layer pairs 1004. The gate-replacement process can also include depositing one or more conductive materials through slit opening 1014 to fill the lateral recesses formed after removing the sacrificial layers of dielectric layer pairs 1004 and later-deposited sacrificial layers 1010 using one or more thin film deposition processes, such as CVD, PVD, ALD, or any combination thereof. The conductive materials can thus form the conductive layers of pairs 1024 of stack structure 1022 as well as contact landing layers 1030 on the conductive layers of pairs 1024. In other words, the sacrificial layers of dielectric layer pairs 1004 and later-deposited sacrificial layers 1010 are replaced with the conductive layers of pairs 1024 and contact landing layers 1030, respectively, by the gate-replacement process, according to some implementations. Accordingly, first and second sets 1001 and 1003 of dielectric layer pairs 1004 are replaced with first and second sets of pairs 1024 of stack structure 1022, according to some implementations. The conductive layers in first set 1021 of pairs 1024 can function as the GIDL lines, and the conductive layers in second set 1023 of pairs 1024 can function as the SSG lines, as described above in detail. It is understood that in some examples in which stack structure 1002 is a memory stack, the gate replacement process may be skipped.

As illustrated in FIG. 10G, slit structure 1016 is formed by depositing a spacer into slit opening 1014 (shown in FIG. 10F). In some implementations, one or more dielectric materials, such as silicon oxide, is deposited using CVD, PVD, ALD, or any combination thereof, to fill slit opening 1014, followed by a planarization process, such as CMP, to remove the excessive dielectric materials. It is understood that in some examples, the spacer may be formed on the sidewall of slit opening 1014 to partially fill slit opening 1014, and conductive materials may be deposited afterward to fill the remaining space of slit opening 1014. As a result, slit structure 1016 can extend vertically through dielectric layer 1012 and stack structure 1022 (including first and second sets 1021 and 1023 of pairs 1024) and replace the part cut structure 1006 extending through second set 1023 of pairs 1024. The remainder of the cut structure 1006 that extends through first set 1021 of pairs 1024 can remain intact. Moreover, slit structure 1016 can extend through and cut off contact landing layers 1030 on second set 1023 of pairs 1024, while leaving contact landing layers 1030 on first set 1021 of pairs 1024 intact. That is, contact landing layers 1030 on first set 1021 of pairs 1024 are spaced apart from slit structure 1016 in the x-direction, and contact landing layers 1030 on second set 1023 of pairs 1024 are cut off by slit structure 1016 from the x-direction, according to some implementations.

Figure 11A:
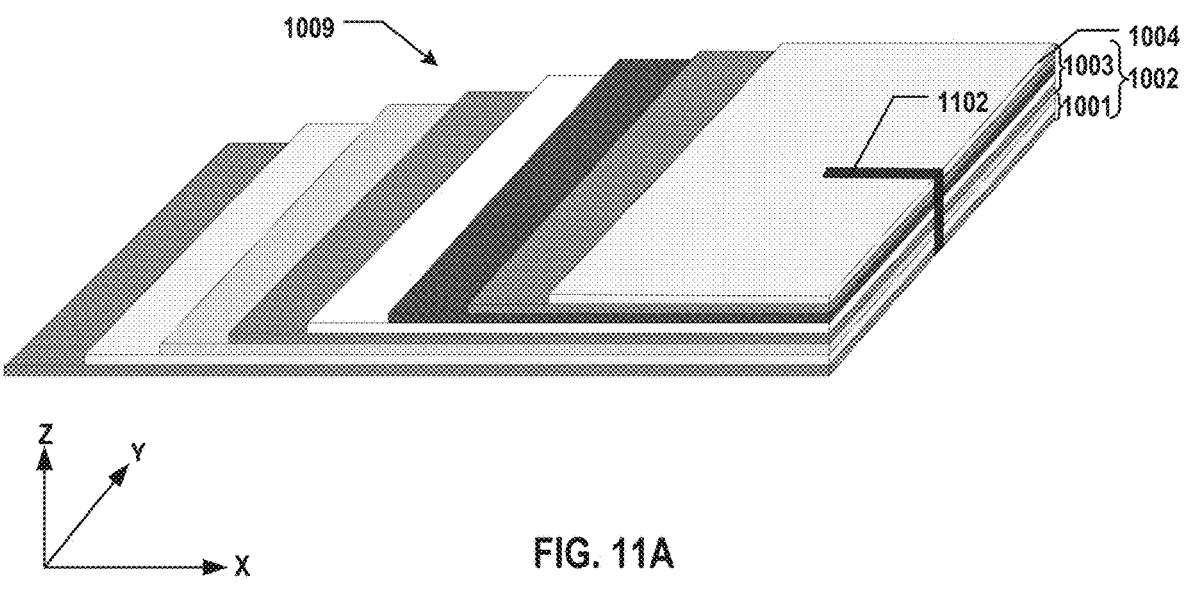
FIGS. 11A and 11B illustrate a fabrication process for forming another 3D memory device having a staircase structure, according to some aspects of the present disclosure.
Figure 11B:
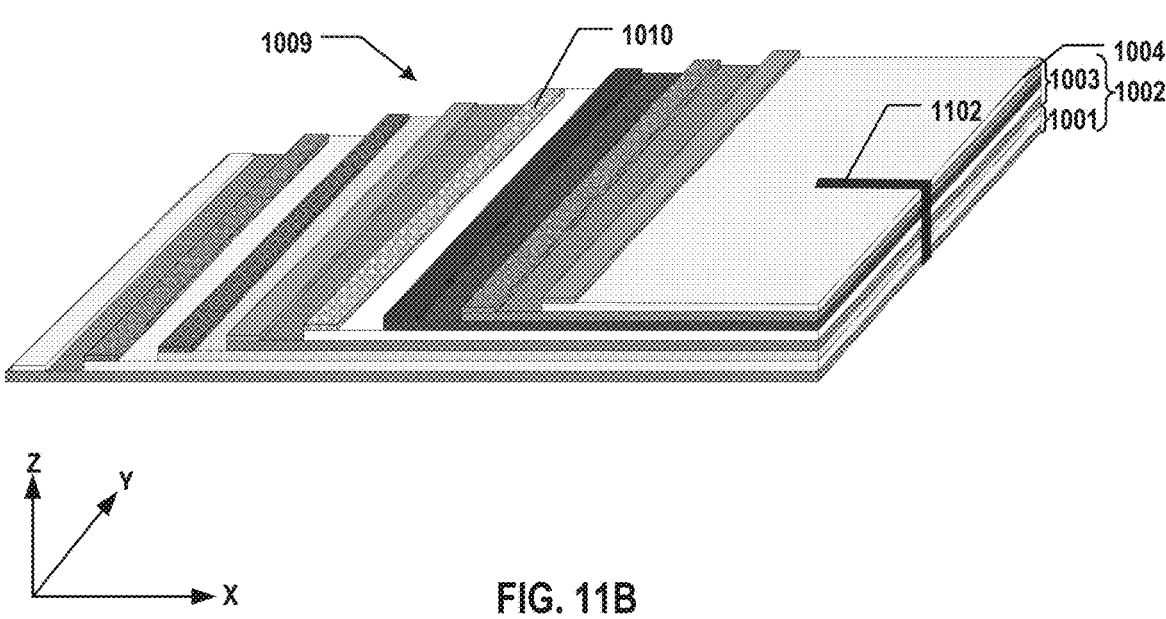

It is understood that in some examples, cut structure 1006 through first and second sets 1001 and 1003 of dielectric layer pairs 1004 of stack structure 1002 may not extend to staircase structure 1009 (e.g., as shown in FIGS. 9A and 9B). As illustrated in FIG. 11A, a cut structure 1102 extending through first and second sets 1001 and 1003 of dielectric layer pairs 1004 is patterned by lithography to be outside of staircase structure 1009, for example, in the core array region (e.g., corresponding to SSG cut structure 512 in "H" cut 510 of FIG. 5). As illustrated in FIG. 11B, sacrificial layers 1010 (and contact landing layers 1030 formed therefrom in FIG. 10G) are formed in staircase structure 1009 and thus, are spaced apart from cut structure 1102 in the x-direction (word line direction).

Although not shown, it is understood that a plurality of channel structures may be formed in the core array region of the stack structure prior to or after the formation of the staircase structure in the staircase region of the stack structure. Each channel structure can extend vertically through the stack structure. In some implementations, to form the channel structure, a channel hole extending vertically through the stack structure is formed, and a memory film and a semiconductor channel are sequentially formed over a sidewall of the channel hole.

According to one aspect of the present disclosure, a 3D memory device includes a stack structure, and a slit structure extending. The stack structure includes interleaved conductive layers and dielectric layers. Edges of the interleaved conductive layers and dielectric layers define a staircase structure. Each one of the conductive layers has a thickened portion in the staircase structure. the Thickened portion extends along a first direction. The slit structure extends through the stack structure and along a second direction perpendicular to the first direction, such that the slit structure cuts off at least one, but not all, of the thickened potions of the conductive layers.

In some implementations, at least the thickened portion of a first conductive layer of the conductive layers is continuous along the first direction and spaced apart from the slit structure in the second direction, and at least the thickened portion of a second conductive layer of the conductive layers is discontinuous along the first direction and cut off by the slit structure from the second direction.

In some implementations, the 3D memory device further includes a channel structure extending through the stack structure. In some implementations, the first conductive layer is closer to a source end of the channel structure than the second conductive layer.

In some implementations, the first conductive layer includes a GIDL line, and the second conductive layer includes a select gate line electrically disconnected from the GIDL line.

In some implementations, the 3D memory device further includes a semiconductor layer in contact with the channel structure. In some implementations, the first conductive layer is closer to the semiconductor layer than the second conductive layer.

In some implementations, the semiconductor layer includes N-type doped polysilicon.

In some implementations, a dimension of the first conductive layer in the second direction is greater than a dimension of the second conductive layer in the second direction.

In some implementations, the 3D memory device further includes a cut structure extending through the first conductive layer.

In some implementations, the cut structure stops at the thickened portion of the first conductive layer.

In some implementations, the thickened portions of the conductive layers include a metal.

According to another aspect of the present disclosure, a 3D memory device includes a semiconductor layer, a stack structure, and a channel structure. The stack structure includes interleaved conductive layers and dielectric layers. Edges of the interleaved conductive layers and dielectric layers define a staircase structure. Each one of the conductive layers has a thickened portion in the staircase structure. The thickened portion extends along a first direction. The channel structure extends through the stack structure and in contact with the semiconductor layer. At least the thickened portion of a first conductive layer of the conductive layers is continuous along the first direction. At least the thickened portion of a second conductive layer of the conductive layers is discontinuous along the first direction. The first conductive layer is closer to the semiconductor layer than the second conductive layer.

In some implementations, the 3D memory device further includes a slit structure extending through the stack structure and along a second direction perpendicular to the first direction, such that the slit structure cuts off the thickened portion of the second conductive layer from the second direction and is spaced away from the thickened portion of the first conductive layer in the second direction.

In some implementations, the first conductive layer includes a GIDL line, and the second conductive layer includes a select gate line electrically disconnected from the GIDL line.

In some implementations, the semiconductor layer includes N-type doped polysilicon.

In some implementations, the 3D memory device further includes a cut structure extending through the first conductive layer.

In some implementations, the cut structure stops at the thickened portion of the first conductive layer.

In some implementations, the thickened portions of the conductive layers include a metal.

According to still another aspect of the present disclosure, a system includes a 3D memory configured to store data. The 3D memory device includes a semiconductor layer, a stack structure, and a channel structure. The stack structure includes interleaved conductive layers and dielectric layers. Edges of the interleaved conductive layers and dielectric layers define a staircase structure. Each one of the conductive layers has a thickened portion in the staircase structure. The thickened portion extends along a first direction. The channel structure extends through the stack structure and in contact with the semiconductor layer. At least the thickened portion of a first conductive layer of the conductive layers is continuous along the first direction. At least the thickened portion of a second conductive layer of the conductive layers is discontinuous along the first direction. The first conductive layer is closer to the semiconductor layer than the second conductive layer. The system also includes a memory controller coupled to the 3D memory device and configured to control operations of the channel structure via the first conductive layer and the second conductive layer.

In some implementations, the first conductive layer includes a GIDL line, and the second conductive layer includes a select gate line electrically disconnected from the GIDL line.

In some implementations, the memory controller is configured to control a GIDL erase operation of the channel structure via at least the GIDL line, and control a read operation of the channel structure via at least the select gate line.

According to yet another aspect of the present disclosure, a method for forming a 3D memory device is disclosed. A stack structure including interleaved first material layers and second material layers is formed. A staircase structure of the stack structure is formed. Third material layers each disposed on a respective one of the first material layers in the staircase structure and extending along a first direction are formed. A slit opening extending through the stack structure and along a second direction perpendicular to the first direction is formed, such that the slit opening cuts off at least one, but not all, of the third material layers.

In some implementations, a spacer is deposited into the slit opening to form a slit structure.

In some implementations, the first and third material layers include a same dielectric material. In some implementations, prior to depositing the spacer, the first material layers and the third material layers are replaced with conductive layers through the slit opening.

In some implementations, each one of the conductive layers has a thickened portion in the staircase structure.

In some implementations, a semiconductor layer is formed, such that the stack structure is formed on the semiconductor layer.

In some implementations, the semiconductor layer is doped with an N-type dopant.

In some implementations, to form the stack structure, a first layer of the first material layers and a second layer of the first material layers above the first layer are formed, such that the third material layer on the first layer is spaced apart from the slit structure in the second direction, and the third material layer on the second layer is cut off by the slit opening from the second direction.

In some implementations, prior to forming the third material layers, a cut structure extending through the first layer of the first material layers and the second layer of the first material layers is formed.

In some implementations, the slit opening is aligned with the cut structure in the first direction, such that the slit opening removes part of the cut structure extending through the second layer of the first material layers.

In some implementations, to form the stack structure, after forming the cut structure, additional interleaved first material layers and second material layers are formed above the second layer of the first material layers.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

24

What is claimed is:

1. A three-dimensional (3D) memory device, comprising:
a stack structure comprising interleaved conductive layers and dielectric layers, wherein edges of the interleaved conductive layers and dielectric layers define a staircase structure, and each one of the conductive layers has a thickened portion in the staircase structure, the thickened portion extending along a first direction; and
a slit structure extending through the stack structure and along a second direction perpendicular to the first direction, such that the slit structure cuts off a portion of more than one, but not all, of the thickened portions of the conductive layers,
wherein the slit structure comprises a dielectric layer; and
wherein the interleaved conductive layers and dielectric layers stacked along a third direction perpendicular to the first direction and the second direction.

2. The 3D memory device of claim 1, wherein
at least the thickened portion of a first conductive layer of the conductive layers is continuous along the first direction and spaced apart from the slit structure in the second direction; and
a portion of at least the thickened portion of a second conductive layer of the conductive layers is discontinuous along the first direction and cut off by the slit structure from the second direction.

3. The 3D memory device of claim 2, further comprising a channel structure extending through the stack structure, wherein the first conductive layer is closer to a source end of the channel structure than the second conductive layer.

4. The 3D memory device of claim 3, wherein the first conductive layer comprises a gate-induced-drain-leakage (GIDL) line, and the second conductive layer comprises a select gate line electrically disconnected from the GIDL line.

5. The 3D memory device of claim 3, further comprising a semiconductor layer in contact with the channel structure, wherein the first conductive layer is closer to the semiconductor layer than the second conductive layer.

6. The 3D memory device of claim 5, wherein the semiconductor layer comprises N-type doped polysilicon.

7. The 3D memory device of claim 2, wherein a dimension of the first conductive layer in the second direction is greater than a dimension of the second conductive layer in the second direction.

8. The 3D memory device of claim 2, further comprising a cut structure extending through the first conductive layer.

9. The 3D memory device of claim 8, wherein the cut structure stops at the thickened portion of the first conductive layer.

10. The 3D memory device of claim 1, wherein the thickened portions of the conductive layers comprise a metal.

11. A three-dimensional (3D) memory device, comprising:
a semiconductor layer;
a stack structure comprising interleaved conductive layers and dielectric layers, wherein edges of the interleaved conductive layers and dielectric layers define a staircase structure, and each one of the conductive layers has a thickened portion in the staircase structure, the thickened portion extending along a first direction;
a channel structure extending through the stack structure and in contact with the semiconductor layer; and
a slit structure extending through the stack structure and along a second direction perpendicular to the first direction,
wherein the slit structure comprises a dielectric layer;

at least the thickened portion of a first conductive layer of the conductive layers is continuous along the first direction;

at least the thickened portion of a second conductive layer of the conductive layers is discontinuous along the first direction, the first conductive layer being closer to the semiconductor layer than the second conductive layer;

the slit structure cuts off a portion of more than one of the thickened portions of the conductive layers; and the interleaved conductive layers and dielectric layers stacked along a third direction perpendicular to the first direction and the second direction.

12. The 3D memory device of claim 11, wherein the slit structure cuts off a portion of the thickened portion of the second conductive layer from the second direction and is spaced away from the thickened portion of the first conductive layer in the second direction.

13. The 3D memory device of claim 1, wherein the slit structure is electrically insulated from the conductive layers.

14. The 3D memory device of claim 1, wherein the slit structure comprises only the dielectric layer without a conductive contact.

15. The 3D memory device of claim 11, wherein the slit structure is electrically insulated from the conductive layers.

16. The 3D memory device of claim 11, wherein the slit structure comprises only the dielectric layer without a conductive contact.

\* \* \* \* \*